United States Patent
Kagotani

(10) Patent No.: US 10,763,456 B2
(45) Date of Patent: Sep. 1, 2020

(54) EL DEVICE USE FRONT PLATE AND LIGHTING DEVICE

(71) Applicant: TOPPAN PRINTING CO., LTD., Taito-ku (JP)

(72) Inventor: Akihito Kagotani, Taito-ku (JP)

(73) Assignee: TOPPAN PRINTING CO., LTD., Taito-ku (JP)

(*) Notice: Subject to any disclaimer, the term of this patent is extended or adjusted under 35 U.S.C. 154(b) by 0 days.

(21) Appl. No.: 15/230,554

(22) Filed: Aug. 8, 2016

(65) Prior Publication Data

US 2016/0343991 A1 Nov. 24, 2016

Related U.S. Application Data

(63) Continuation of application No. PCT/JP2015/053264, filed on Feb. 5, 2015.

(30) Foreign Application Priority Data

| Feb. 7, 2014 | (JP) | ................................. 2014-022153 |
| Feb. 7, 2014 | (JP) | ................................. 2014-022154 |
| Aug. 27, 2014 | (JP) | ................................. 2014-173291 |

(51) Int. Cl.
*H01L 51/52* (2006.01)
*G02B 1/115* (2015.01)
(Continued)

(52) U.S. Cl.
CPC .......... *H01L 51/5275* (2013.01); *G02B 1/115* (2013.01); *H01L 27/32* (2013.01);
(Continued)

(58) Field of Classification Search
None
See application file for complete search history.

(56) References Cited

U.S. PATENT DOCUMENTS 8,035,881 B2 * 10/2011 Luten ..................... B60R 1/088
359/265
8,080,939 B2 * 12/2011 Nomura ........... B29D 11/00596
313/506
(Continued)

FOREIGN PATENT DOCUMENTS

JP 8-083688 A 3/1996
JP 2003-316291 A 11/2003
(Continued)

OTHER PUBLICATIONS

International Search Report dated Apr. 21, 2015 in PCT/JP2015/053264, filed Feb. 5, 2015.
(Continued)

*Primary Examiner* — Michelle Mandala
*Assistant Examiner* — Jordan M Klein
(74) *Attorney, Agent, or Firm* — Oblon, McClelland, Maier & Neustadt, L.L.P.

(57) ABSTRACT

A front plate for a lighting device includes a translucent substrate having a first surface, a high refractive index layer formed on the first surface of the translucent substrate and having a refractive index higher than a refractive index of the translucent substrate, and an electrically conductive light reflection layer formed on a surface of the high refractive index layer on an opposite side of the translucent substrate. The electrically conductive light reflection layer is formed on a portion corresponding to a non-luminous region around a luminous region on the surface of the high refractive index layer.

26 Claims, 23 Drawing Sheets

(51) Int. Cl.
 *H01L 27/32* (2006.01)
 *H05B 33/28* (2006.01)
 *H05B 33/24* (2006.01)
(52) U.S. Cl.
 CPC ...... *H01L 51/5268* (2013.01); *H01L 51/5271* (2013.01); *H05B 33/28* (2013.01); *H01L 51/5206* (2013.01); *H05B 33/24* (2013.01)

(56) References Cited

U.S. PATENT DOCUMENTS

| | | | | |
|---|---|---|---|---|
| 2002/0154379 A1* | 10/2002 | Tonar | ............... | B60Q 1/2665 359/267 |
| 2004/0113550 A1* | 6/2004 | Adachi | ............... | H01L 51/525 313/512 |
| 2005/0110388 A1* | 5/2005 | Takeuchi | ............... | G02B 6/0041 313/493 |
| 2005/0265029 A1* | 12/2005 | Epstein | ............... | G02B 3/0056 362/339 |
| 2009/0174319 A1* | 7/2009 | Shimoji | ............... | H01L 51/5268 313/504 |
| 2011/0180835 A1* | 7/2011 | Ono | ............... | H01L 51/5212 257/98 |
| 2012/0155093 A1* | 6/2012 | Yamada | ............... | H01L 51/5275 362/311.01 |
| 2013/0056778 A1* | 3/2013 | Sano | ............... | H01L 51/5212 257/98 |
| 2015/0023024 A1* | 1/2015 | Ohta | ............... | F21V 7/0008 362/296.01 |
| 2015/0124457 A1* | 5/2015 | Sanga | ............... | B32B 38/0004 362/293 |
| 2016/0325528 A1* | 11/2016 | Berard | ............... | B32B 17/10036 |

FOREIGN PATENT DOCUMENTS

| | | |
|---|---|---|
| JP | 2009-009861 A | 1/2009 |
| JP | 2009-152148 A | 7/2009 |
| JP | 2011-43937 A | 3/2011 |
| JP | 2012-084391 A | 4/2012 |
| JP | 2013-54837 A | 3/2013 |
| JP | 2013-114802 A | 6/2013 |
| JP | 2013-246932 A | 12/2013 |
| JP | 2014-017128 A | 1/2014 |
| WO | WO 2011/016086 A1 | 2/2011 |
| WO | WO 2013/153700 A | 10/2013 |

OTHER PUBLICATIONS

Office Action dated Aug. 28, 2018 in corresponding Japanese Patent Application No. 2014-022153, filed Feb. 7, 2014 (with English-language Translation), 10 pages.

Office Action dated Aug. 28, 2018 in corresponding Japanese Patent Application No. 2014-022154, filed Feb. 7, 2014 (with English-language Translation), 8 pages.

* cited by examiner

EL DEVICE USE FRONT PLATE AND LIGHTING DEVICE

CROSS-REFERENCE TO RELATED APPLICATIONS

The present application is a continuation of International Application No. PCT/JP2015/053264, filed Feb. 5, 2015, which is based upon and claims the benefits of priority to Japanese Application No. 2014-022153, filed Feb. 7, 2014, Japanese Application No. 2014-022154, filed Feb. 7, 2014 and Japanese Application No. 2014-173291, filed Aug. 27, 2014. The entire contents of all of the above applications are incorporated herein by reference.

BACKGROUND OF THE INVENTION

Field of the Invention

The present invention relates to an EL device use front plate which improves light extraction efficiency and relates to a lighting device equipped with the EL device use front plate.

Discussion of the Background

In recent years, in lighting devices such as generally used organic electroluminescent (EL) devices (hereinafter is also referred to as EL device(s) or device(s)), for example, the efficiency of light extraction, i.e. discharging light from a glass substrate into the air, is only 20%. Therefore, considering mass production of panels, for example, films are externally attached to such devices in many cases. Although it depends on the structure of a panel, if a film is externally attached to a device, light extraction efficiency is about 25%, resulting in large waste of light. The reason for the large waste of light is that the refractive index of a substrate, which is mainly made of glass or plastic, is different from that of an organic layer, and light is totally reflected off the interface between the substrate and the organic layer.

To further improve light extraction efficiency, a light extraction structure is also needed to be provided inside the device.

Progress is being made in light extraction efficiency for lighting devices as can be seen in PTLs 1 to 3, for example.

PTL 1: JP-A-H08-083688
PTL 2: JP-A-2009-009861
PTL 3: JP-A-2003-316291

SUMMARY OF THE INVENTION

According to one aspect of the present invention, a front plate for a lighting device includes a translucent substrate having a first surface, a high refractive index layer formed on the first surface of the translucent substrate and having a refractive index higher than a refractive index of the translucent substrate, and an electrically conductive light reflection layer formed on a surface of the high refractive index layer on an opposite side of the translucent substrate. The electrically conductive light reflection layer is formed on a portion corresponding to a non-luminous region around a luminous region on the surface of the high refractive index layer.

According to another aspect of the present invention, a front plate for a lighting device includes a translucent substrate having a first surface, a high refractive index layer formed on the first surface of the translucent substrate, and an electrically conductive light reflection layer formed on a portion of a back surface of the high refractive index layer on an opposite side of the translucent substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
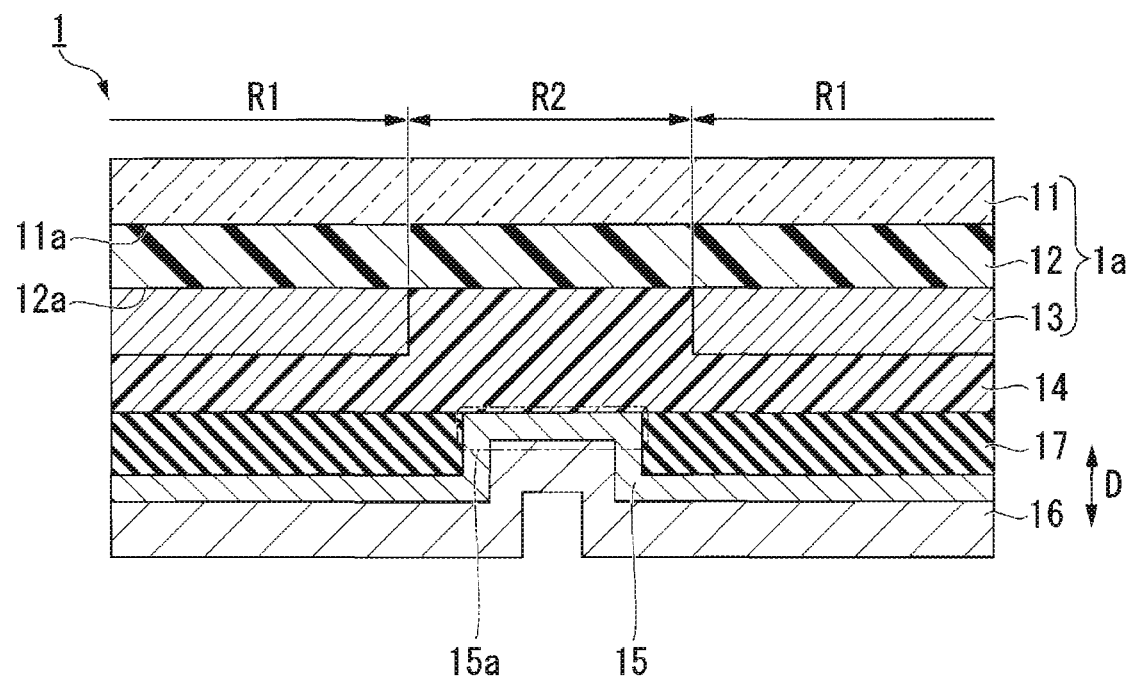
FIG. 1 is a side cross-sectional view illustrating a lighting device according to a first embodiment of the present invention.

The embodiments will now be described with reference to the accompanying drawings, wherein like reference numerals designate corresponding or identical elements throughout the various drawings.

With reference to the drawings, hereinafter will be described some embodiments in which a lighting device is an organic EL device.

First Embodiment

As shown in FIG. 1, a lighting device 1 according to a first embodiment of the present invention includes a translucent substrate 11, a high refractive index layer 12, an electrically conductive light reflection layer 13, a transparent anode part 14, a light emitting element part 15, and a cathode part 16. The high refractive index layer 12 is laminated on one surface (first surface) 11a of the translucent substrate 11. The electrically conductive light reflection layer 13 is laminated on a part of a back surface 12a of the high refractive index layer 12 which is on the opposite side to the surface where the translucent substrate 11 is provided. The transparent anode part 14 is laminated on a portion on the back surface 12a of the high refractive index layer 12 where the electrically conductive light reflection layer 13 is not laminated. The light emitting element part 15 is laminated on the transparent anode part 14 which is on the opposite side to the surface where the electrically conductive light reflection layer 13 is provided. The cathode part 16 is laminated on the light emitting element part 15 which is on the opposite side to the surface where the transparent anode part 14 is provided.

The translucent substrate 11, the high refractive index layer 12, and the electrically conductive light reflection layer 13 configure an EL device use front plate is of the present embodiment.

The translucent substrate 11, which is formed in a sheet, is made of glass or a plastic material, such as PET (polyethylene terephthalate) or PEN (polyethylene naphtahalate). The translucent substrate 11 has a thickness in a range from about 0.3 to 3 mm, for example. Generally, when the translucent substrate 11 is thin, the lighting device 1 can be bent. Thus, the lighting device 1 can be used for applications that need flexibility. In this case, the organic EL device can be fabricated on a long substrate wound in a roll by roll-to-roll processing. When the translucent substrate 11 is thick, the lighting device 1 can be used for applications that need rigidity.

Materials that can be used for the high refractive index layer 12 include, for example, acrylic resins and urethane resins, and hybrid materials of an organic substance and an inorganic substance, such as a silsesquioxane.

The high refractive index layer 12 has a thickness preferably in a range of 0.5 to 100 μm, and more preferably in a range of 0.5 to 30 μm. When fine particles having light scattering properties, described later, are added to the high refractive index layer 12, the size of the fine particles has to be made smaller than the thickness of the high refractive index layer 12. When the thickness of the high refractive index layer 12 is thinner than 0.5 μm, the size of fine particles has to be so small that the light scattering properties are degraded, and thus the fine particles no longer serve as light scattering materials, which is not favorable. Also, when the thickness of the high refractive index layer 12 is thinner than 0.5 μm, the fine particles do not serve as a geometric-optical interface, being affected such as by an interference effect or a tunnel effect. This is not favorable because a sufficient quantity of light cannot be guided to the scattering part 18.

When the thickness of the high refractive index layer 12 is more than 100 μm, the moisture content in the material of the high refractive index layer 12 becomes so large that the light emitting element part 15 is damaged. When fine particles having light scattering properties, described later, are added, surface roughness is increased, causing leakage. Also, the high refractive index layer 12 is too thick to serve as a scattering layer, resulting in degraded light transmission, which is not favorable.

The roughness of the surface of the high refractive index layer 12 contacting the transparent anode part 14 is preferably Ra<10 nm. When the surface roughness is larger than this, sufficient smoothness will not be achieved if the surface of the transparent anode part 14 is polished, and resultantly uniform light emission cannot be obtained in the light emitting element part 15, which is not favorable. The roughness of the surface of the high refractive index layer 12 contacting the transparent anode part 14 does not have any specific lower limit. When the surface has a smoothness with Ra of 0.05 nm or more, the surface is smooth enough. If the surface is smoother than this, the smoothness does not contribute any more to improving uniformity of the light emitting plane. Thus, the smoothness with Ra of 0.05 nm or more is sufficient.

It is preferable that the high refractive index layer 12 has a refractive index not smaller than that of the light emitting element part 15. Specifically, the refractive index of the high refractive index layer 12 is preferably 1.5 or more. More specifically, the refractive index of the high refractive index layer 12 is preferably 1.5 or more but 2.0 or less. When the refractive index of the high refractive index layer 12 is 1.7 or more, light extraction efficiency can be enhanced, and a larger quantity of luminous flux can be extracted from inside the translucent substrate. Thus, the refractive index of the high refractive index layer 12 is more preferably 1.7 or more but 1.85 or less.

It is preferable that the refractive index of the high refractive index layer 12 is higher than that of the translucent substrate 11.

Here, refractive index of the high refractive index layer 12 refers to a refractive index in the normal direction of the translucent substrate 11 or in the visual recognition direction of the lighting device 1. A refractive index, if it has anisotropy, only has to be set in this direction in the range mentioned above. The refractive index of the high refractive index layer 12 in the in-plane direction of the translucent substrate 11 may be outside the above range.

The high refractive index layer 12 is laminated covering one surface 11a of the translucent substrate 11.

The electrically conductive light reflection layer 13 is formed of Al (aluminum) or Ag (silver), for example, and has electrical conductivity for efficiently conducting electricity and light reflectivity for reflecting light. The electrically conductive light reflection layer 13 can be prepared by vapor-depositing the above materials on the high refractive index layer 12. In this case, when the thickness of the electrically conductive light reflection layer 13 is tens of nanometers or more, light can be reflected. The electrically conductive light reflection layer 13 is in a rectangular shape in side view (as viewed from a direction perpendicular to a thickness direction D of the translucent substrate 11).

The transparent anode part 14 is laminated on the electrically conductive light reflection layer 13 which is on the opposite side to the surface where the high refractive index layer 12 is provided, the transparent anode part 14 also being laminated on portions of the back surface 12a of the high refractive index layer 12 where the electrically conductive light reflection layer 13 is not laminated. The transparent anode part 14 can be formed of a transparent material, such as ITO (indium tin oxide), for example.

When the device is viewed parallel to the thickness direction D, a region where the electrically conductive light reflection layer 13 is formed serves as a conductive reflection part R1 reflecting light L2, described later, and a region where the electrically conductive light reflection layer 13 is not formed serves as an opening R2.

Figure 2:
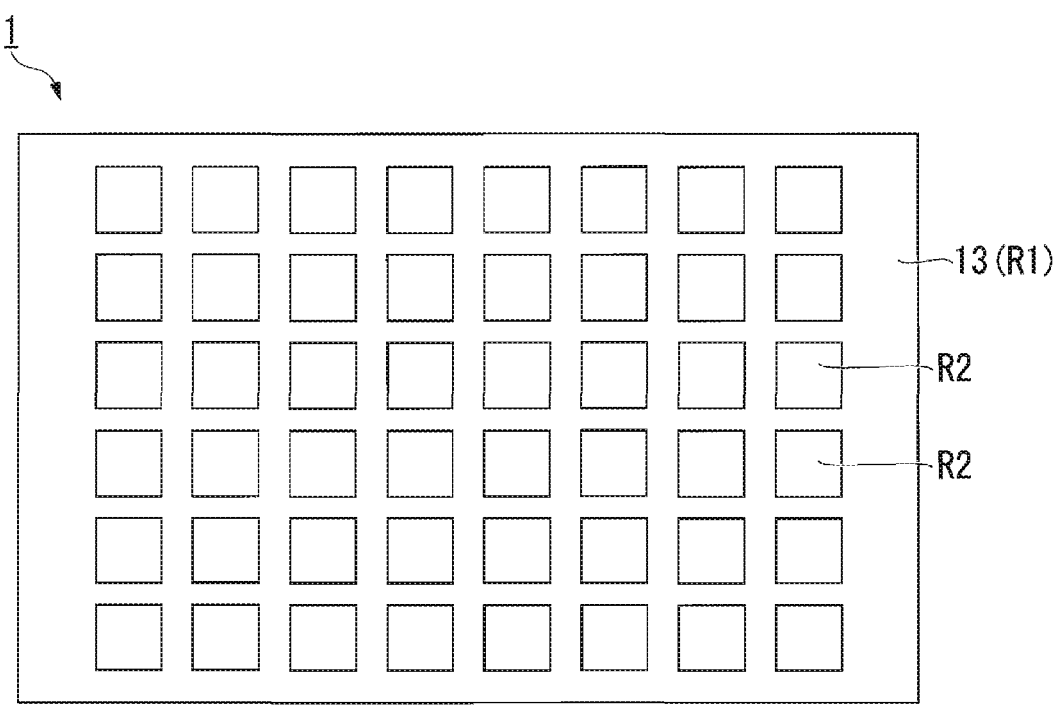
FIG. 2 is a plan view for explaining a layout of a conductive reflection part and openings of the lighting device according to the first embodiment of the present invention.

As shown in FIG. 2, each opening R2 is formed in a rectangular shape. A plurality of the openings R2 are arrayed in a lattice pattern. Configuring the openings R2 of the electrically conductive light reflection layer 13 in this way, each one of the openings R2 is made unnoticeable. Thus, the light emission with the plurality of the openings R2 as a whole can be visually equivalent to surface emission.

The transparent anode part 14 is laminated covering the back surface 12a of the high refractive index layer 12.

As shown in FIG. 1, in the present embodiment, an electrically insulating layer 17 is laminated between the transparent anode part 14 and the light emitting element part 15. The electrically insulating layer 17 is formed at least on a part of the surface of the transparent anode part 14 so as to be located on the light emitting element part 15 side surface and overlapped with the electrically conductive light reflection layer 13 in the thickness direction D.

In other words, the electrically insulating layer 17 is formed at least in a region of overlapping with the conductive reflection part R1 in the thickness direction D.

The electrically insulating layer 17 serves as a light shielding layer that blocks light, and can be formed of various plastic materials, such as acrylic resins and urethane resins, and inorganic materials. To block electricity (to provide insulation properties), the thickness of the electrically insulating layer 17 preferably ranges from one to hundreds of micrometers. In side view, the electrically insulating layer 17 is formed in a rectangular shape.

In the case where the electrically insulating layer 17 has been laminated, the light emitting element part 15 is formed by ink jet printing using the electrically insulating layer 17 as a barrier. Thus, the lighting device 1 can be fabricated mitigating waste of material used for forming the light emitting element part 15.

Materials preferably used for the light emitting element part 15 are those which allow electric charges injected from an electrode to move and allow holes to recombine with electrons. Specifically, such materials include tris(8-hydroxyquinolinato) aluminum complexes (Alq3), bis(benzoquinolinolato) beryllium complexes (BeBq), tri(dibenzoylmethyl) phenanthroline europium complexes (Eu(DBM)3 (Phen)), and di-tolyl vinyl biphenyl (DTVBi). The thickness of the light emitting element part 15 is preferably not more than hundreds of nanometers, although it depends on the configuration.

The light emitting element part 15 is laminated covering the surface of the transparent anode part 14 which is on the opposite side to the surface where the electrically conductive light reflection layer 13 is provided.

The cathode part 16 is formed of Al or Ag, for example, similarly to the electrically conductive light reflection layer 13, and serves as a layer having electrical conductivity and light reflectivity. The thickness of the cathode part 16 preferably ranges from a few nanometers to 500 nm.

The cathode part 16 is laminated covering the surface of the light emitting element part 15 which is on the opposite side to the surface where the electrically insulating layer 17 is provided.

The electrically conductive light reflection layer 13 of the lighting device 1 thus configured can be formed in a predetermined pattern by means of a known method, such as vapor deposition or etching.

The translucent substrate 11, the high refractive index layer 12, the electrically conductive light reflection layer 13, the transparent anode part 14, and the like can be fabricated by known roll-to-roll processing similarly to organic EL devices of conventional art.

Figure 3:
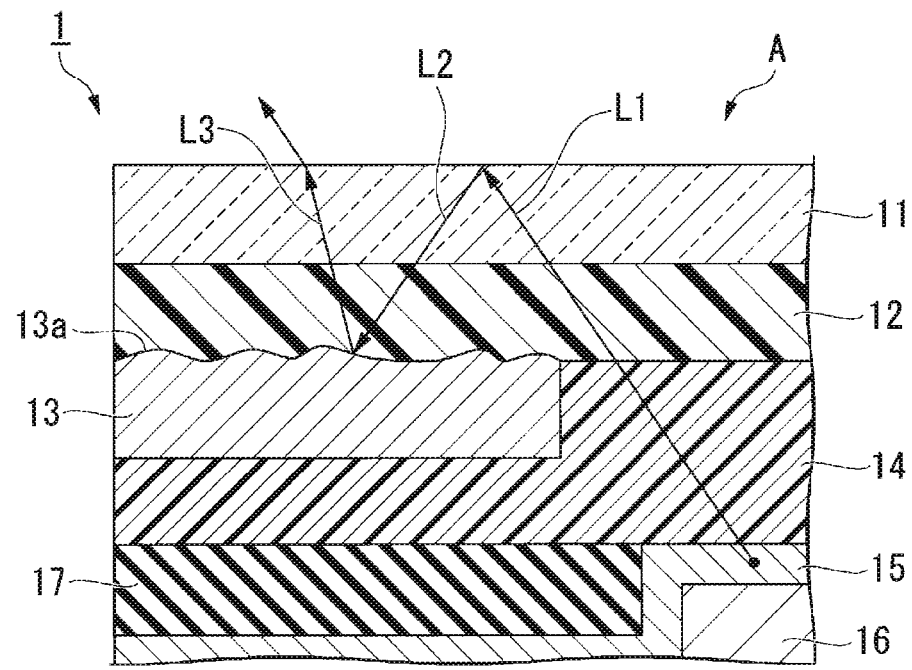
FIG. 3 is a cross-sectional view for explaining action of a principal part of the lighting device according to the first embodiment of the present invention.

As shown in FIG. 3, in the lighting device 1 thus configured and fabricated, light L1 is emitted from the light emitting part 15a of the light emitting element part 15. Typically, the light L1, when emitted from the translucent substrate 11 to the outside, is totally reflected, as light L2, off the interface between the translucent substrate 11 and air A due to the difference in refractive index therebetween. In this condition, the light L2 fails to be emitted, causing optical loss.

However, in the lighting device 1, the reflected light L2 hits and is reflected off a surface 13a of the electrically conductive light reflection layer 13 on the high refractive index layer 12 side to become light L3. Being reflected, the direction of the light L3 is changed from the direction of the light L1. Thus, the light L2, which originally would have been totally reflected and wasted, can be extracted from the translucent substrate 11.

To change the direction of the light L3 from the direction of the light L1, the surface 13a of the electrically conductive light reflection layer 13 is preferably rough to some extent rather than flat. The surface 13a preferably has an arithmetic average roughness (Ra) of 100 μm or more but 500 μm or less, for example.

Figure 4:
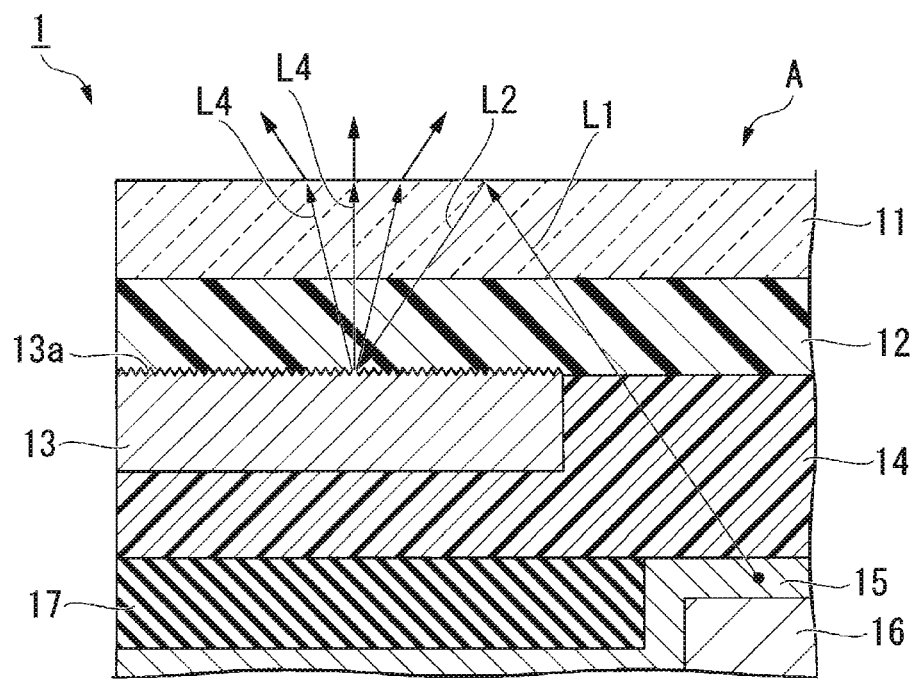
FIG. 4 is a cross-sectional view for explaining action of a principal part of the lighting device according to the first embodiment of the present invention.

As shown in FIG. 4, when the surface 13a of the electrically conductive light reflection layer 13 is rougher (has a larger arithmetic average roughness), the light L2 is scattered on the surface 13a of the electrically conductive light reflection layer 13 to become scattered light L4. In this case, the device can be imparted with a performance which is equivalent to the scattering effect exerted by adding fine particles to the high refractive index layer 12.

As described above, the EL device use front plate 1a and the lighting device 1 of the present embodiment are provided with the electrically conductive light reflection layer 13. Thus, if light emitted from the light emitting part 15a of the light emitting element part 15 is reflected off the interface between the translucent substrate 11 and the air A, the light can be re-reflected off the electrically conductive light reflection layer 13. Thus, the light extraction efficiency of the lighting device 1 can be improved and light can be efficiently extracted.

The electrically conductive light reflection layer 13 is disposed over the back surface 12a of the high refractive index layer 12. Thus, when the lighting device 1 is viewed from the translucent substrate 11 side, one feels as if the electrically conductive light reflection layer 13 is luminous, although it is not luminous itself in fact.

The lighting device 1 is originally structured to reduce total reflection in the interface between the translucent substrate 11 and the air A by the electrically conductive light reflection layer 13. However, the lighting device 1 is not structured to reflect light, which has been totally reflected and returns to the device side (light emitting element part 15 side), off the cathode part 16 side of the lighting device 1, but is structured to reflect the light off the electrically conductive light reflection layer 13 as much as possible. Thus, the light which has been totally reflected and returned is unlikely to be transmitted through the light emitting element part 15 and be absorbed.

When the transparent anode part 14 is made thinner, resistance of the transparent anode part 14 increases accordingly, causing degradation in in-plane luminous distribution in the light emission surface. The simplest way of decreasing resistance of the transparent anode part 14 is to increase the thickness of the transparent anode part 14, which, however, decreases the transmittance of light (light fails to transmit through the transparent anode part 14), creating a tradeoff relationship.

A typically used method of decreasing resistance of the transparent anode part 14 is to crystallize the transparent anode part 14 by annealing at about 200° C. or more. In this case, the substrate to be heated has to withstand the annealing temperature. When an organic material is used for the material of the substrate, the material is likely to be degraded due to the high temperature.

In this regard, with the configuration of the lighting device 1, the electrically conductive light reflection layer 13, which is used as a light-reflecting material, also contributes to decreasing resistance of the transparent anode part 14. Thus, the transparent anode part 14 does not have to be annealed at high temperature. Accordingly, for the transparent anode part 14, generally used materials, such as ITO, and materials of relatively high resistance, or conductive polymers, such as poly(3,4-ethylenedioxythiophene)-poly(styrene sulfonate) (PEDOT), can be used.

As described above, the electrically conductive light reflection layer 13 has a role of not only reflecting light but also decreasing resistance of the transparent anode part 14. Due to the presence of the electrically conductive light reflection layer 13, the transparent anode part 14 can be made as thin as possible, and light absorption can be reduced.

Methods of decreasing resistance of the transparent anode part 14 include, for example, providing an auxiliary interconnection as described in PTL 3 mentioned above. However, in a typically used configuration, portions where an auxiliary interconnection is provided are not luminous. Thus, luminous parts and non-luminous parts are unavoidably created in the light emitting plane of the lighting device, degrading the product design.

The electrically insulating layer 17 is disposed via the transparent anode part 14 in such a manner that the electrically insulating layer 17 is in intimate contact with the transparent anode part 14 where the electrically conductive light reflection layer 13 is provided, i.e. the electrically insulating layer 17 overlaps with the electrically conductive light reflection layer 13 when viewed in the thickness direction D. This eliminates loss of emitted light at the electrically conductive light reflection layer 13. Thus, the light emitting element part 15 does not have to be patterned, and fabrication process steps are simplified.

The high refractive index layer 12 is oriented to the light emitting element part 15, i.e. the high refractive index layer 12 is provided nearer the light emitting element part 15 than the translucent substrate 11 is. Thus, the surface of the translucent substrate 11 (the surface which is which is on the opposite side to the surface where the high refractive index layer 12 is provided) can be made flat and easily cleaned and at the same time designing of the lighting device 1 can be improved.

As described above, the translucent substrate 11, the high refractive index layer 12, the electrically conductive light reflection layer 13, the transparent anode part 14, and the like can be fabricated by roll-to-roll processing. Thus, films of organic materials can also be similarly prepared by roll-to-roll processing. According to conventional art, fabrication process steps need to include preparing a device structure on a glass substrate, shaping a light scattering film on a plastic base material, and then bringing the light scattering film into intimate contact with the glass substrate via an adhesive material or the like. Therefore, compared with the conventional fabrication process steps, the present embodiment can simplify the process steps and shorten lead time of fabrication, and thus is advantageous for reducing cost.

The ratio of the light emission area to the total area of the light emitting element part 15, when viewed in the thickness direction D, is defined as an aperture ratio. In this case, with a large aperture ratio, in-plane luminance is increased but light-emission efficiency is decreased. On the contrary, with a small aperture ratio, light-emission efficiency is increased but in-plane luminance is decreased. Thus, it is necessary to determine the aperture ratio, depending on which one of the in-plane luminance and the light-emission efficiency importance is placed on.

When the aperture ratio is decreased, the ratio of the electrically conductive light reflection layer 13 is necessarily increased. However, a low aperture ratio has an effect of reducing temperature rise of the lighting device 1 as a whole, by transfer of heat generated at the light emitting element part 15. Accordingly, the lifetime of the light emitting element part 15 can be improved (extended).

In the present embodiment, the high refractive index layer 12 may include (contain) fine particles having light scattering properties (not shown). This configuration has an effect of further shielding the electrically conductive light reflection layer 13 when viewed from outside (from the translucent substrate 11 side), and improves the effect of extracting light from the translucent substrate 11. Materials that can be used for the above fine particles include $TiO_2$, $SiO_2$, $Al_2O_3$, $ZrO$, $CaCO_3$, $BaSO_4$, $Mg_3Si_4O_{10}(OH)_2$, and the like. Further, the fine particles can have various sizes, ranging from tens of nanometers to hundreds of micrometers, for example. It should be noted that any materials and particle sizes can be used for the fine particles.

In this case, the amount of fine particles added to the high refractive index layer 12 is preferably 40 w % or less. If the additive amount exceeds 40 w %, the fine particles agglomerate, which is not favorable.

Instead of adding fine particles to the high refractive index layer 12, there can be used a method, as described above, of forming convexities and concavities in the interface between the electrically conductive light reflection layer 13 and the high refractive index layer 12 to exert a scattering effect.

By providing the high refractive index layer 12 containing fine particles, light is scattered inside the high refractive index layer 12 to provide uniform light. In this way, unevenness of light as a surface light source can be reduced, and angular distribution of light can be made uniform.

On a surface (second surface) of the translucent substrate 11 which is on the opposite side to the surface (first surface) where the high refractive index layer 12 is provided, a micro-concavo-convex structure, not shown, may be formed. The micro-concavo-convex structure can be in a microlens shape (e.g., hemispherical or elliptically spherical shape) with an outer diameter of about 0.1 μm to 500 μm, a quadrangular pyramid shape, or a shape spangled with micro particles, or the like. All of these micro-concavo-convex structures aim to change the direction of scattering light and extract light emitted inside the lighting device 1 from the translucent substrate 11.

By providing the micro-concave-convex structure to the translucent substrate 11, light emission angle and light extraction efficiency can be controlled.

The translucent substrate 11 may be configured to include fine particles having light scattering properties. The fine particles used can be configured similarly to those used for the high refractive index layer 12.

By providing the translucent substrate 11 containing fine particles, light distribution properties can be controlled.

Figure 5:
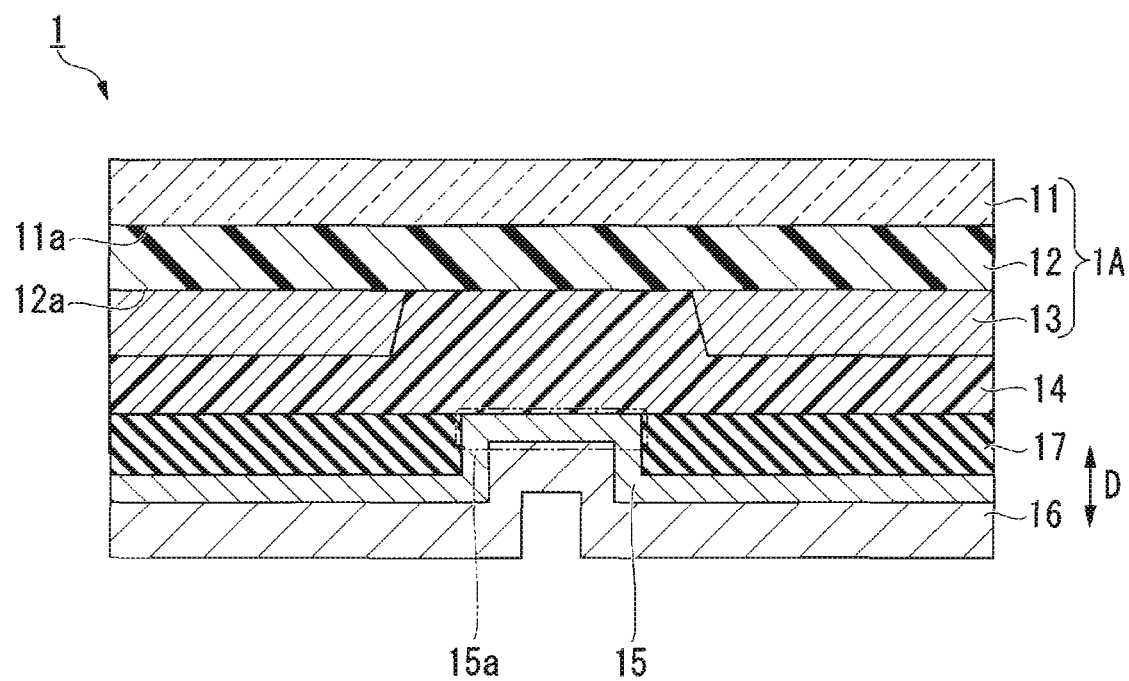
FIG. 5 is a side cross-sectional view illustrating a modification of the lighting device according to the first embodiment of the present invention.

In the present embodiment, the electrically conductive light reflection layer 13 and the electrically insulating layer 17 are formed in a rectangular shape in side view. However, as shown in FIG. 5, the electrically conductive light reflection layer 13 and the electrically insulating layer 17 may be formed in a tapered shape, so that the width of the opening is narrowed toward the translucent substrate 11.

Figure 6:
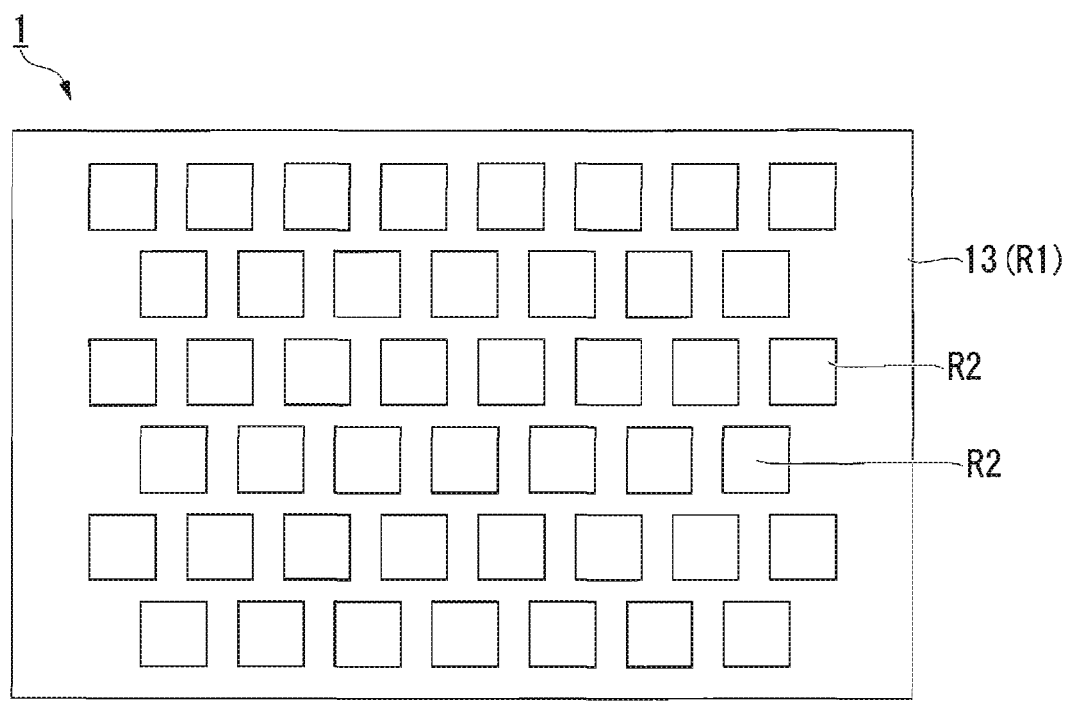
FIG. 6 is a plan view for explaining a layout of a conductive reflection part and openings of a modification of the lighting device according to the first embodiment of the present invention.

The shape of each of the openings R2 and the arrangement of the plurality of the openings R2 may be modified as below. For example, in an example shown in FIG. 6, a plurality of openings R2, each being in a rectangular shape, are disposed in a honeycomb pattern (staggered pattern). By configuring the openings R2 of the electrically conductive light reflection layer 13 in this way, the openings R2 can be arranged at regular intervals, thereby improving light extraction efficiency.

Figure 7:
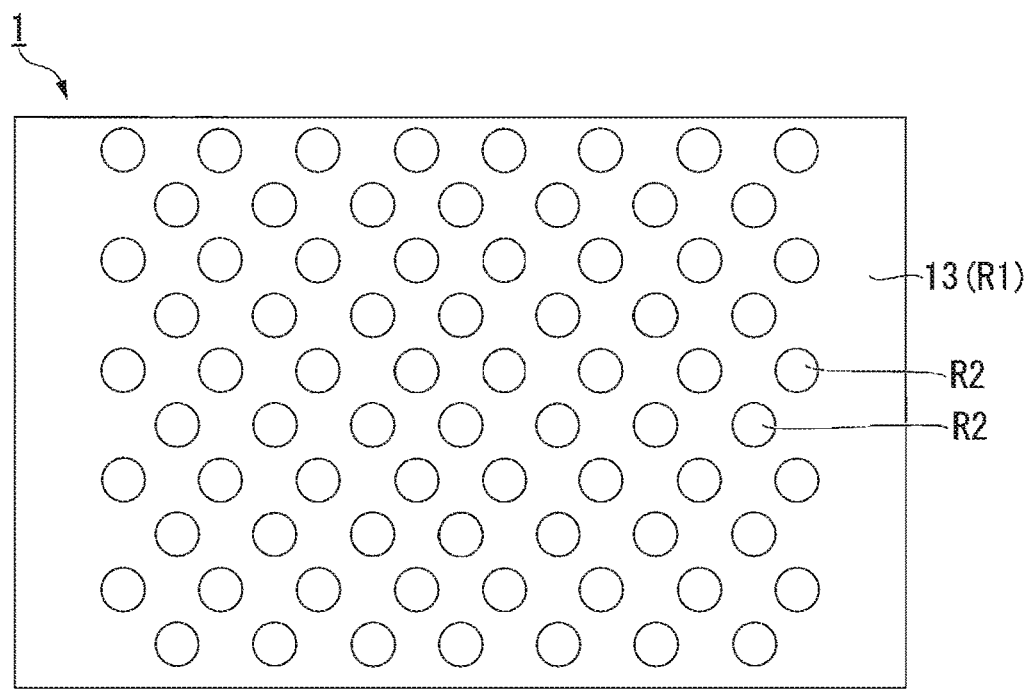
FIG. 7 is a plan view for explaining a layout of a conductive reflection part and openings of a modification of the lighting device according to the first embodiment of the present invention.

In an example shown in FIG. 7, a plurality of openings R2, each being in a circular shape, are arranged in a honeycomb shape. By configuring the openings R2 of the electrically conductive light reflection layer 13 in this way, the openings R2 can be arranged at more regular intervals, thereby further improving light extraction efficiency.

Figure 8:
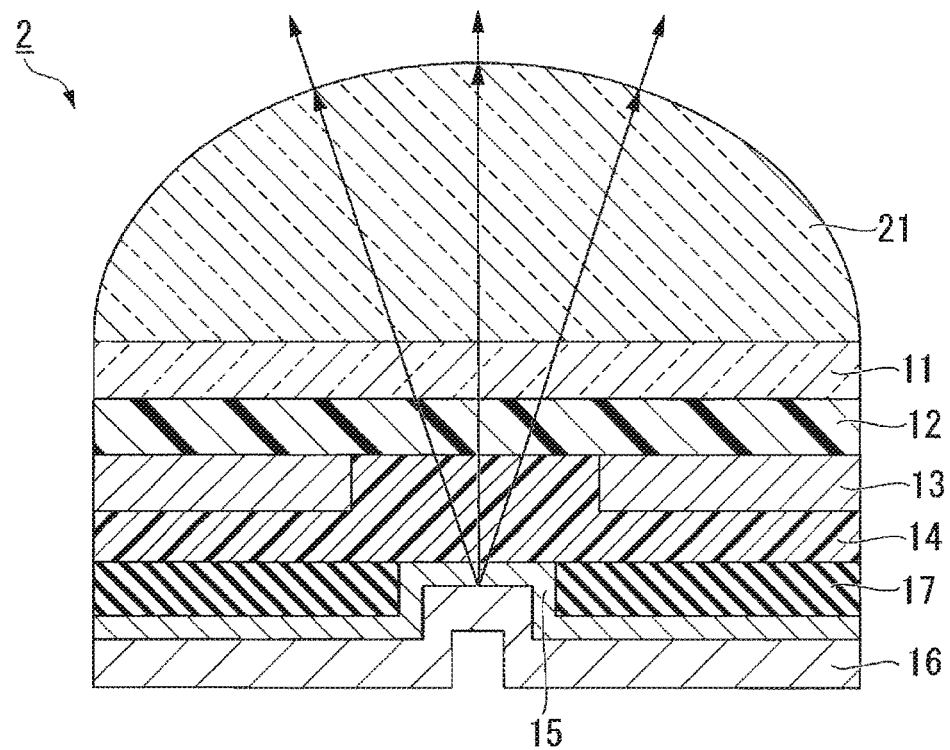
FIG. 8 is a side cross-sectional view illustrating a modification of the lighting device according to the first embodiment of the present invention.

As in a lighting device 2 shown in FIG. 8, a semi-columnar lens 21 may be arranged on the surface of the translucent substrate 11, in alignment with each configuration of the lighting device 1. With this configuration, use efficiency of light can be enhanced.

The first embodiment of the present invention has so far been specifically described with reference to the drawings. However, specific configurations are not limited to this embodiment. Any modifications, combinations and deletions, for example, of the configurations not departing from the spirit of the present invention should be encompassed by the present invention.

The lighting device 1 is configured to include the electrically insulating layer 17. However, for example, the lighting device 1 does not necessarily have to include the electrically insulating layer 17. With this configuration as well, the light emitting element part 15 can emit light by applying a voltage across the transparent anode part 14 and the cathode part 16.

Figure 9:
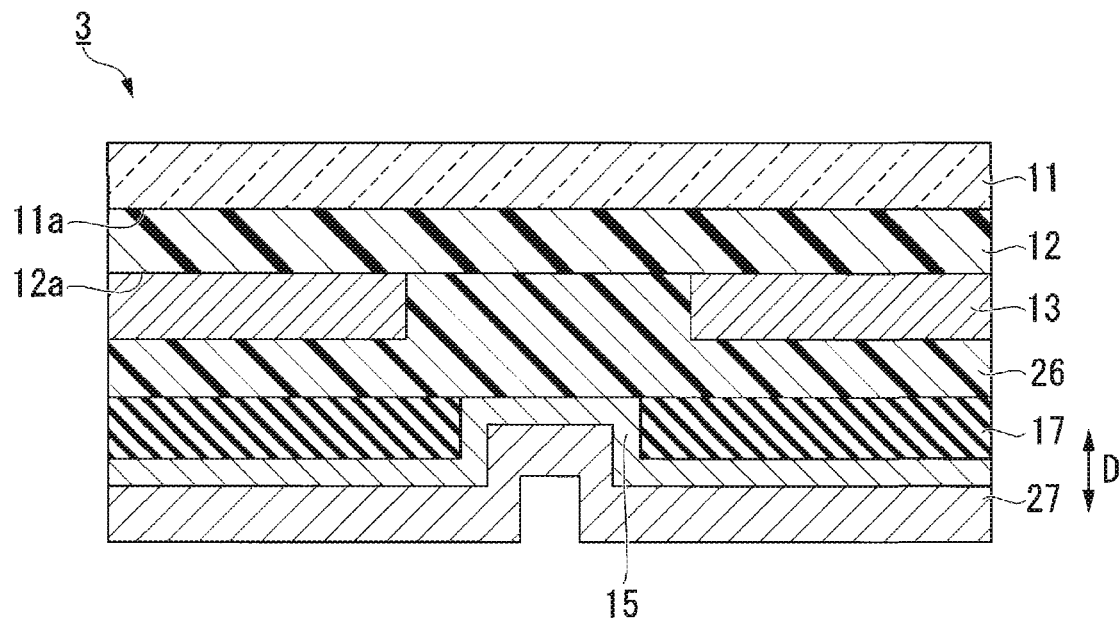
FIG. 9 is a side cross-sectional view illustrating a modification of the lighting device according to the first embodiment of the present invention.

As in a lighting device 3 shown in FIG. 9, in the first embodiment, each configuration of the lighting device 1 may be modified such that the anode and the cathode sandwiching the light emitting element part 15 in the thickness direction D are oppositely provided. Specifically, the lighting device 3 can include a transparent cathode part 26 and an anode part 27 instead of the transparent anode part 14 and the cathode part 16 of the lighting device 1.

Similar to the transparent anode part 14, the transparent cathode part 26 can be laminated on portions of the back surface 12a of the high refractive index layer 12 where the electrically conductive light reflection layer 13 is not laminated, the transparent cathode part 26 also being laminated on the electrically conductive light reflection layer 13 which is on the opposite side to the surface where the high refractive index layer 12 is provided. The transparent cathode part 26 can be formed of the same transparent material as the one used for the transparent anode part 14.

In this example, the light emitting element part 15 is laminated on the transparent cathode part 26 which is on the opposite side to the surface where the electrically conductive light reflection layer 13 is provided.

The anode part 27 is laminated on the light emitting element part 15 which is on the opposite side to the surface where the transparent cathode part 26 is provided. The anode part 27 can be formed of the same material as the one used for the cathode part 16.

The lighting device 3 thus configured can also provide advantageous effects similar to those of the lighting device 1 of the foregoing embodiment.

Second Embodiment

Figure 10:
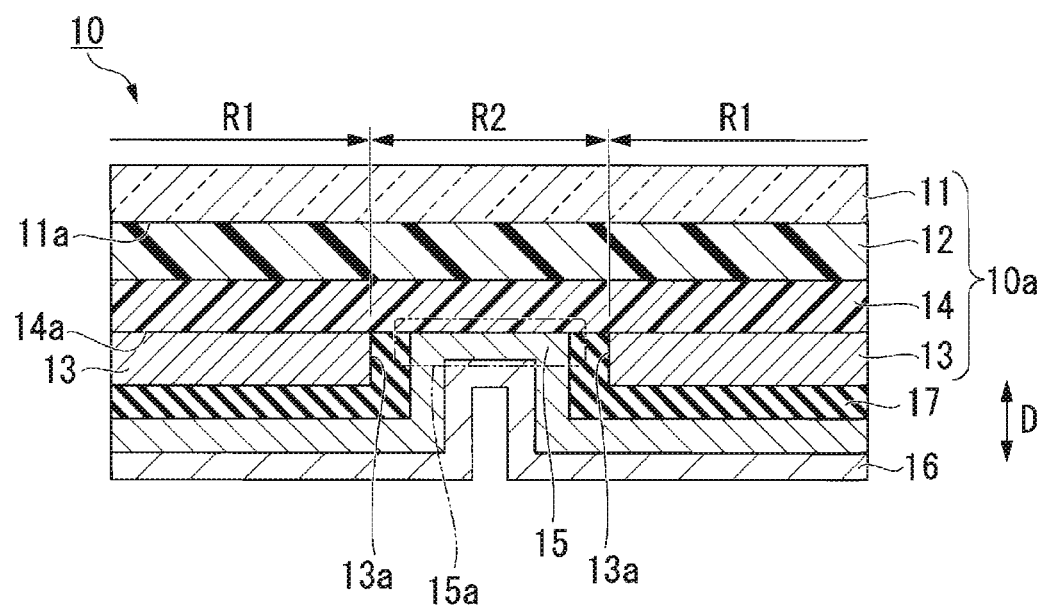
FIG. 10 is a side cross-sectional view illustrating a lighting device according to a second embodiment of the present invention.

As shown in FIG. 10, a lighting device 10 according to a second embodiment of the present invention includes a translucent substrate 11, a high refractive index layer 12, a transparent anode part 14, an electrically conductive light reflection layer 13, a light emitting element part 15, and a cathode part 16. The high refractive index layer 12 is laminated on one surface 11a (a first surface) of the translucent substrate 11. The transparent anode part 14 is laminated on the high refractive index layer 12 which is on the opposite side to the surface where the translucent substrate 11 is provided. The electrically conductive light reflection layer 13 is laminated on a part of a back surface 14a of the transparent anode part 14 which is on the opposite side to the surface where the high refractive index layer 12 is provided. The cathode part 16 is laminated on the light emitting element part 15 which is on the opposite side to the surface where the electrically conductive light reflection layer 13 is provided. The light emitting element part 15 is laminated on portions of the back surface 14a of the transparent anode part 14 where the electrically conductive light reflection layer 13 is not laminated.

In the present embodiment, the translucent substrate 11, the high refractive index layer 12, the transparent anode part 14, and the electrically conductive light reflection layer 13 configure an EL device use front plate 10a of the present invention.

It should be noted that components identical with those of the first embodiment are given the same reference signs to omit duplicate description.

The present embodiment is different from the first embodiment in that the transparent anode part 14 is laminated covering the surface of the high refractive index layer 12 which is on the opposite side to the surface where the translucent substrate 11 is provided.

The electrically conductive light reflection layer 13 is formed in a rectangular shape in side view (when viewed from the direction perpendicular to the thickness direction D of the translucent substrate 11). The electrically conductive light reflection layer 13 can also be provided by vapor-depositing Al, Ag or the like on the transparent anode part 14. In this case, light can be reflected off the electrically conductive light reflection layer 13 when the thickness thereof is not less than tens of nanometers.

In the present embodiment, when the device is viewed parallel to the thickness direction D, the region where the electrically conductive light reflection layer 13 is laminated serves as a conductive reflection part R1, described later, which reflects light L2, and the region where the electrically conductive light reflection layer 13 is not laminated serves as an opening R2.

Figure 11:
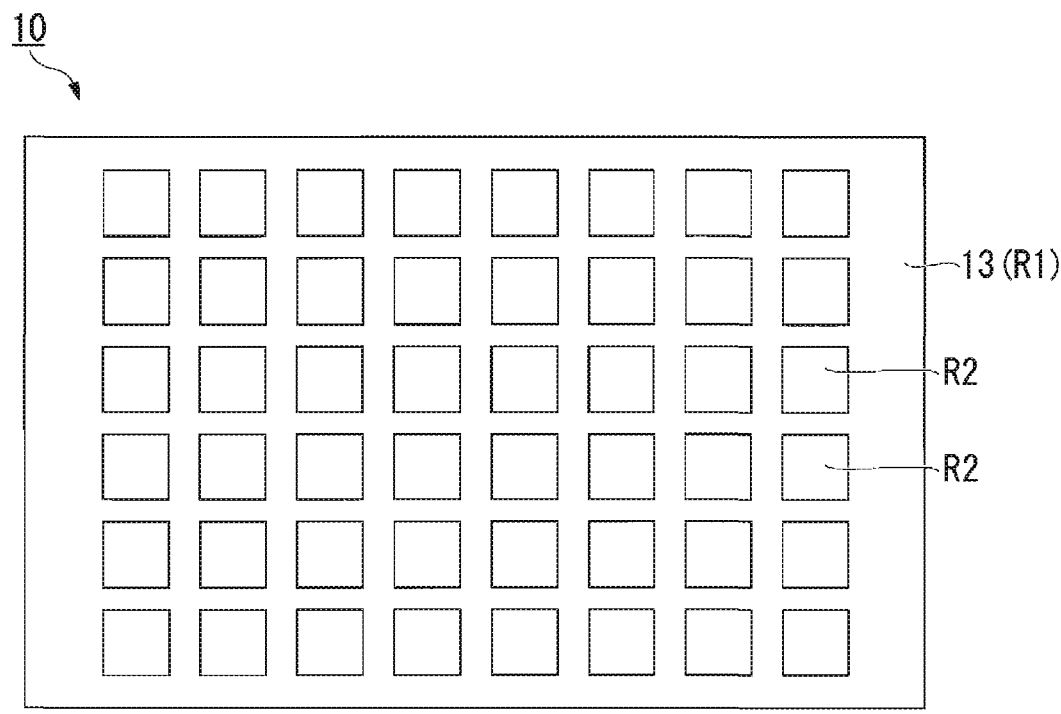
FIG. 11 is a plan view for explaining a layout of a conductive reflection part and openings of the lighting device according to the second embodiment of the present invention.

As shown in FIG. 11, the openings R2 are each formed in a rectangular shape. A plurality of the openings R2 are arrayed in a lattice pattern. By configuring the openings R2 of the electrically conductive light reflection layer 13 in this way, the openings R2 can be made unnoticeable. Thus, the plurality of openings R2 as a whole can provide emission equivalent to surface emission.

As shown in FIG. 10, in the present embodiment, the lighting device 10 includes an electrically insulating layer 17 between the electrically conductive light reflection layer 13 and the light emitting element part 15 so as to cover the electrically conductive light reflection layer 13 laminated on the transparent anode part 14. To insulate electricity (to provide insulation properties), the thickness of the electrically insulating layer 17 is preferably in the range from about one nanometer to hundreds of micrometers.

In this example, the electrically insulating layer 17 is laminated on a surface of the electrically conductive light reflection layer 13 which is on the opposite side to the surface where the transparent anode part 14 is provided and on opposing side surfaces 13a of the adjacent electrically conductive light reflection layers 13 that are provided over the back surface 14a of the transparent anode part 14, thereby covering the electrically conductive light reflection layers 13. In other words, the electrically insulating layer 17 completely insulates the electrically conductive light reflection layer 13 from the light emitting element part 15.

In the present embodiment as well, in the case where the electrically insulating layer 17 has been laminated, the light emitting element part 15 is formed by ink jet printing using the electrically insulating layer 17 as a barrier. Thus, the lighting device 1 can be fabricated mitigating waste of material used for forming the light emitting element part 15.

The light emitting element part 15 is laminated, via the electrically insulating layer 17, on the electrically conductive light reflection layer 13 which is on the opposite side to the surface where the transparent anode part 14 is provided, and on portions of the back surface 14a of the transparent anode part 14 where the electrically conductive light reflection layer 13 is not laminated.

The light emitting element part 15 is laminated covering a surface formed by the transparent anode part 14 and the electrically insulating layer 17 which is on the opposite side to the surface where the high refractive index layer 12 is provided. A part of the light emitting element part 15 is directly in contact with the transparent anode part 14.

In the present embodiment as well, the cathode part 16 is laminated covering the surface of the light emitting element part 15 which is on the opposite side to the surface where the electrically insulating layer 17 is provided.

The electrically conductive light reflection layer 13 of the lighting device 10 thus configured can be formed in a predetermined pattern by a known method, such as vapor deposition and etching.

The translucent substrate 11, the high refractive index layer 12, the transparent anode part 14, the electrically conductive light reflection layer 13, and the like can be fabricated by known roll-to-roll processing similarly to conventional organic EL devices.

Figure 12:
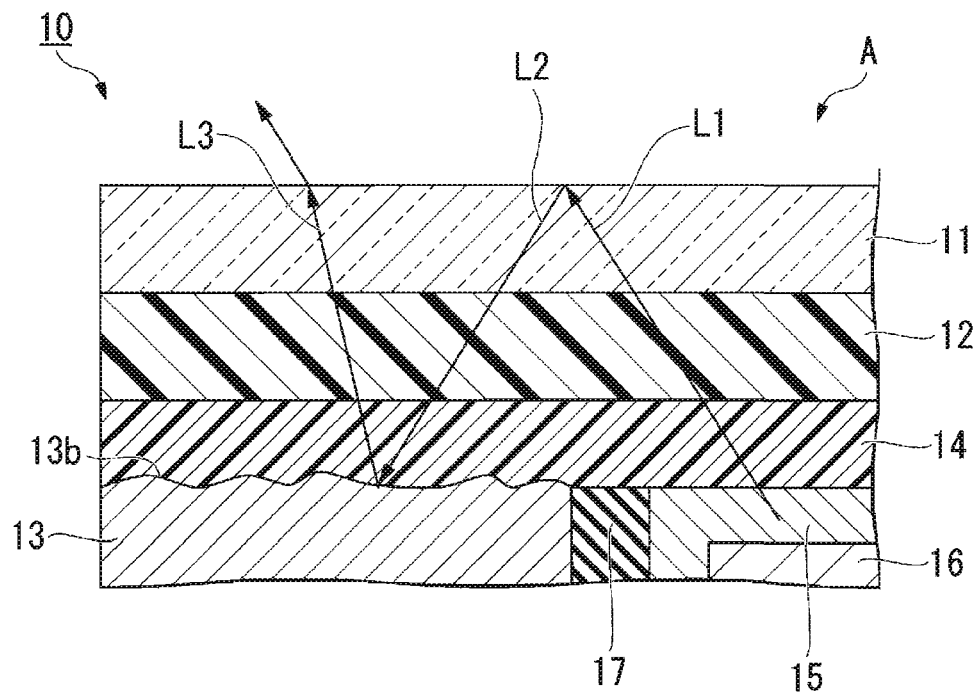
FIG. 12 is a cross-sectional view for explaining action of a principal part of the lighting device according to the second embodiment of the present invention.

As shown in FIG. 12, in the lighting device 10 configured and fabricated in this way, the light L1 emitted from the light emitting part 15a of the light emitting element part 15 is discharged outside from the translucent substrate 11. Typically, the light L1, when discharged outside, is totally reflected, as the light L2, off the interface between the translucent substrate 11 and the air A due to the difference in refractive index therebetween. In this condition, the light L2 fails to be emitted, causing optical loss.

However, in the lighting device 10, the reflected light L2 hits and is reflected off a surface 13b of the electrically conductive light reflection layer 13 on the transparent anode part 14 side to become the light L3. Being reflected off the surface 13b of the electrically conductive light reflection layer 13, the direction of the light L3 is changed from the direction of the light L1. Thus, the light L2, which originally would have been totally reflected and wasted, can be extracted from the translucent substrate 11.

To change the direction of the light L3 from the direction of the light L1, the surface 13b of the electrically conductive light reflection layer 13 is preferably rough to some extent rather than flat. The arithmetic average roughness (Ra) of the surface 13b is preferably 100 μm or more but 500 μm or less, for example.

Figure 13:
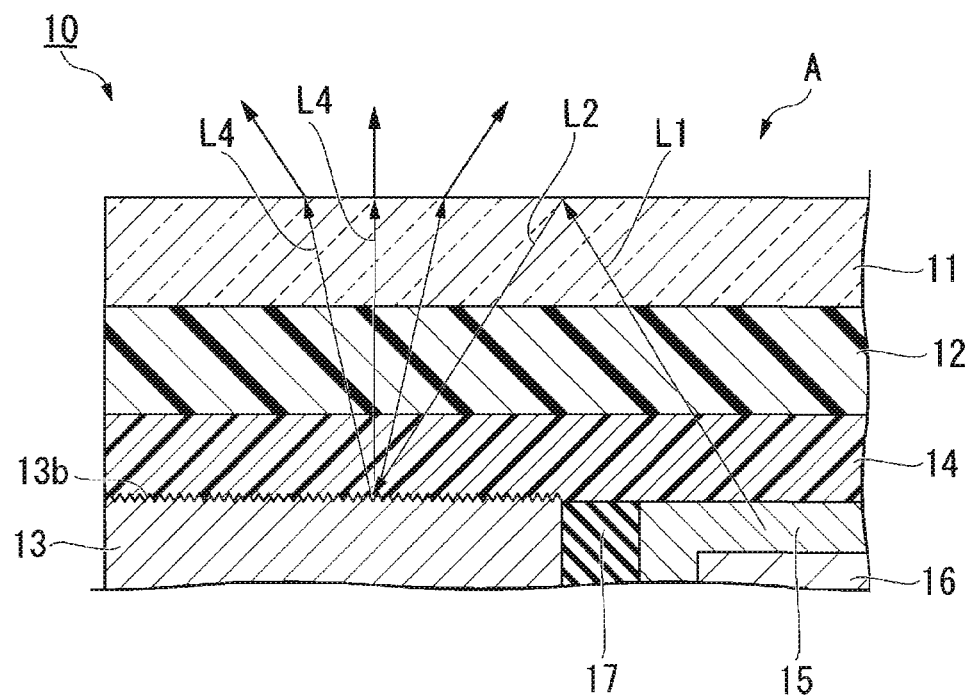
FIG. 13 is a cross-sectional view for explaining action of a principal part of the lighting device according to the second embodiment of the present invention.

As shown in FIG. 13, when the surface 13b of the electrically conductive light reflection layer 13 is rougher (the arithmetic average roughness is larger), the light L2 is scattered on the surface 13b of the electrically conductive light reflection layer 13 to become scattered light L4. In this case, the device can be imparted with a performance which is equivalent to the scattering effect exerted by adding fine particles to the high refractive index layer 12.

As described above, the EL device use front plate 10a and the lighting device 10 of the present embodiment include the electrically conductive light reflection layer 13. Thus, if light emitted from the light emitting part 15a of the light emitting element part 15 is reflected off the interface between the translucent substrate 11 and the air A, the light can be re-reflected off the electrically conductive light reflection layer 13. In this way, light extraction efficiency of the lighting device 10 can be improved, and light can be efficiently extracted.

The electrically conductive light reflection layer 13 is disposed over the back surface 14a of the transparent anode part 14. Thus, when the lighting device 10 is viewed from the translucent substrate 11 side, one feels as if the electrically conductive light reflection layer 13 is luminous, although it is not luminous itself in fact.

The lighting device 10 is originally structured to reduce total reflection in the interface between the translucent substrate 11 and the air A by the electrically conductive light reflection layer 13. However, the lighting device 10 is not structured to reflect light, which has been totally reflected and returns to the device side (light emitting element part 15 side), off the cathode part 16 side of the lighting device 10, but is structured to reflect the light off the electrically conductive light reflection layer 13 as much as possible. Thus, the light which has been totally reflected and returned is unlikely to be transmitted through the light emitting element part 15 and be absorbed.

When the transparent anode part 14 is made thinner, resistance of the transparent anode part 14 increases accordingly, causing degradation in in-plane luminous distribution in the light emission surface. The simplest way of decreasing resistance of the transparent anode part 14 is to increase the thickness of the transparent anode part 14, which, however, decreases the transmittance of light (light fails to transmit through the transparent anode part 14), creating a tradeoff relationship.

A commonly used method of decreasing resistance of the transparent anode part 14 is to crystallize the transparent anode part 14 by annealing at about 200° C. or more. In this case, the substrate to be heated has to withstand the annealing temperature. When an organic material is used for the material of the substrate, the material is likely to be degraded due to the high temperature.

In this regard, with the configuration of the lighting device 10, the electrically conductive light reflection layer 13, which is used as a light-reflecting material, also contributes to decreasing resistance of the transparent anode part 14. Thus, the transparent anode part 14 does not have to be annealed at high temperature. Accordingly, for the transparent anode part 14, generally used materials, such as ITO, and materials of relatively high resistance, or conductive polymers, such as PEDOT, can be used.

As described above, the electrically conductive light reflection layer 13 has a role of not only reflecting light but also decreasing resistance of the transparent anode part 14. Due to the presence of the electrically conductive light reflection layer 13, the transparent anode part 14 can be made as thin as possible, and light absorption can be reduced.

Methods of decreasing resistance of the transparent anode part 14 include, for example, providing an auxiliary interconnection as described in PTL 3 mentioned above. However, in a typically used configuration, portions where the auxiliary interconnection is provided are not luminous. Thus, luminous parts and non-luminous parts are unavoidably created in the light emitting plane of the lighting device, degrading design of products.

The electrically insulating layer 17 is disposed covering the electrically conductive light reflection layer 13 laminated on the transparent anode part 14. This eliminates loss of emitted light at the electrically conductive light reflection layer 13. Thus, the light emitting element part 15 does not have to be patterned, and fabrication process steps are simplified.

Under the condition where the refractive index of the high refractive index layer 12 is 1.7 or more, the light extraction efficiency can be enhanced.

The high refractive index layer 12 is oriented to the light emitting element part 15, i.e. the high refractive index layer 12 is provided nearer the light emitting element part 15 than the translucent substrate 11 is. Thus, the surface of the translucent substrate 11 (the surface which is which is on the opposite side to the surface where the high refractive index layer 12 is provided) can be made flat and easily cleaned and at the same time designing of the lighting device 1 can be improved.

As described above, the translucent substrate 11, the high refractive index layer 12, the transparent anode part 14, the electrically conductive light reflection layer 13, and the like can be fabricated by roll-to-roll processing. Thus, films of organic materials can also be similarly prepared by roll-to-roll processing. According to conventional art, fabrication process steps need to include preparing a device structure on a glass substrate, shaping a light scattering film on a plastic base material, and then bringing the light scattering film into intimate contact with the glass substrate via an adhesive material or the like. Therefore, compared with the conventional fabrication, the present embodiment can simplify the process steps and shorten fabrication lead time, and thus is advantageous for reducing cost.

The ratio of the light emission area to the total area of the light emitting element part 15, when viewed in the thickness direction D, is defined as an aperture ratio. In this case, with a large aperture ratio, in-plane luminance is increased but light-emission efficiency is decreased. On the contrary, with a small aperture ratio, light-emission efficiency is increased but in-plane luminance is decreased. Thus, it is necessary to determine the aperture ratio, depending on which one of the in-plane luminance and the light-emission efficiency importance is placed on.

When the aperture ratio is decreased, the ratio of the electrically conductive light reflection layer 13 is necessarily increased. However, a low aperture ratio has an effect of reducing temperature rise of the lighting device 10 as a whole, by transfer of heat generated at the light emitting element part 15. Accordingly, the lifetime of the light emitting element part 15 can be improved (extended).

With this structure, since the transparent anode part 14 can be formed without patterning, and since the transparent anode part 14 is flat with no convexities and concavities, there is a merit that the surface of the transparent anode part 14 can be polished, which is required for the organic EL device.

In the present embodiment, the high refractive index layer 12 may include (contain) fine particles having light scattering properties (not shown). This configuration has an effect of further shielding the electrically conductive light reflection layer 13 when viewed from outside (from the translucent substrate 11 side), and improves the effect of extracting light from the translucent substrate 11. Materials that can be used for the above fine particles include $TiO_2$, $SiO_2$, $Al_2O_3$, $ZrO$, $CaCO_3$, $BaSO_4$, $Mg_3Si_4O_{10}(OH)_2$, and the like. Further, the fine particles can have various sizes, ranging from tens of nanometers to hundreds of micrometers, for example. It should be noted that any materials and particle sizes can be used for the fine particles.

In this case, the amount of fine particles added to the high refractive index layer 12 is preferably 40 w % or less. If the additive amount exceeds 40 w %, the fine particles agglomerate, which is not favorable.

Instead of adding fine particles to the high refractive index layer 12, there can be used a method, as described above, of forming convexities and concavities in the interface between the electrically conductive light reflection layer 13 and the transparent anode part 14, i.e. the surface 13*b* of the electrically conductive light reflection layer 13 to exert a scattering effect.

By providing the high refractive index layer 12 containing fine particles, light is scattered inside the high refractive index layer 12 to provide uniformity to light. In this way, unevenness of light as a surface light source can be reduced, and angular distribution of light can be made uniform.

A micro-concavo-convex structure, not shown, may be formed on a surface (second surface) of the translucent substrate 11 which is on the opposite side to the surface (first surface) where the high refractive index layer 12 is provided. The micro-concavo-convex structure can be in a microlens shape (e.g., hemispherical or elliptically spherical shape) with an outer diameter of about 0.1 μm to 500 μm, a quadrangular pyramid shape, or a shape spangled with micro particles, or the like. All of these micro-concavo-convex structures aim to change the direction of scattering light and extract light emitted inside the lighting device 1 from the translucent substrate 11.

By providing the micro-concavo-convex structure on the translucent substrate 11, light emission angle and light extraction efficiency can be controlled.

The translucent substrate 11 may be configured to include fine particles having light scattering properties. The fine particles used can be configured similarly to those used for the high refractive index layer 12.

By providing the translucent substrate 11 containing fine particles, light distribution properties can be controlled.

Figure 14:
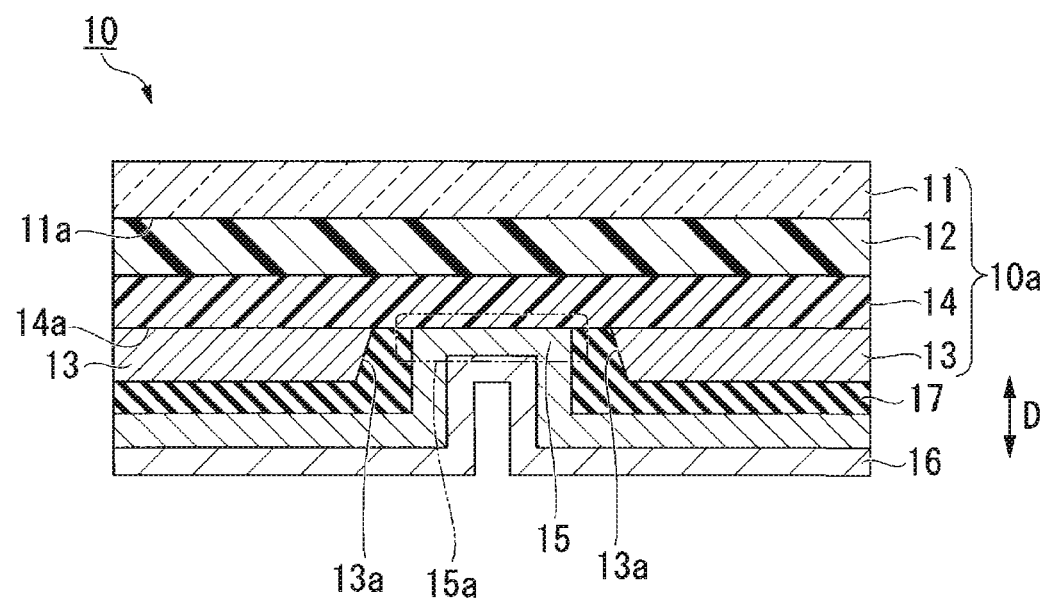
FIG. 14 is a side cross-sectional view illustrating the lighting device according to the second embodiment of the present invention.

In the present embodiment, the electrically conductive light reflection layer 13 is formed in a rectangular shape in side view. However, as shown in FIG. 14, the electrically conductive light reflection layer 13 may be formed in a tapered shape, so that the width of the opening is narrowed toward the translucent substrate 11.

Figure 15:
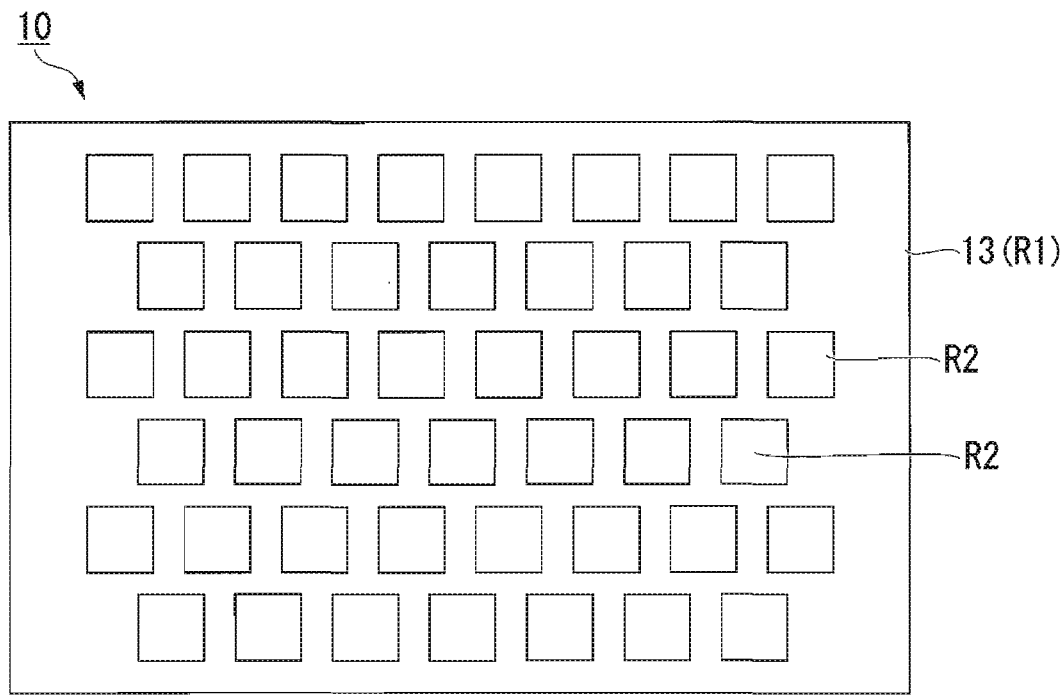
FIG. 15 is a plan view for explaining a layout of a conductive reflection part and openings of a modification of the lighting device according to the second embodiment of the present invention.

The shape of each of the openings R2 and the arrangement of the plurality of the openings R2 may be modified as below. For example, in an example shown in FIG. 15, a plurality of openings R2, each being in a rectangular shape, are disposed in a honeycomb pattern (staggered pattern). By configuring the openings R2 of the electrically conductive light reflection layer 13 in this way, the openings R2 can be arranged at regular intervals, thereby improving light extraction efficiency.

Figure 16:
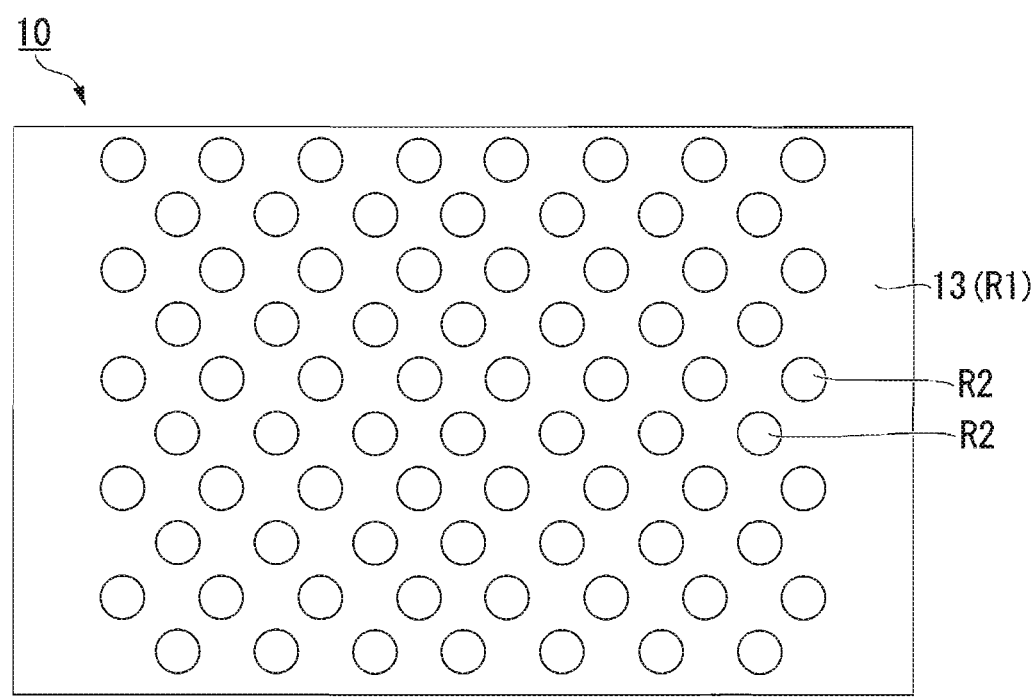
FIG. 16 is a plan view for explaining a layout of a conductive reflection part and openings of a modification of the lighting device according to the second embodiment of the present invention.

In an example shown in FIG. 16, a plurality of openings R2, each being in a circular shape, are arranged in a honeycomb shape. By configuring the openings R2 of the electrically conductive light reflection layer 13 in this way, the openings R2 can be arranged at more regular intervals, thereby further improving light extraction efficiency.

Figure 17:
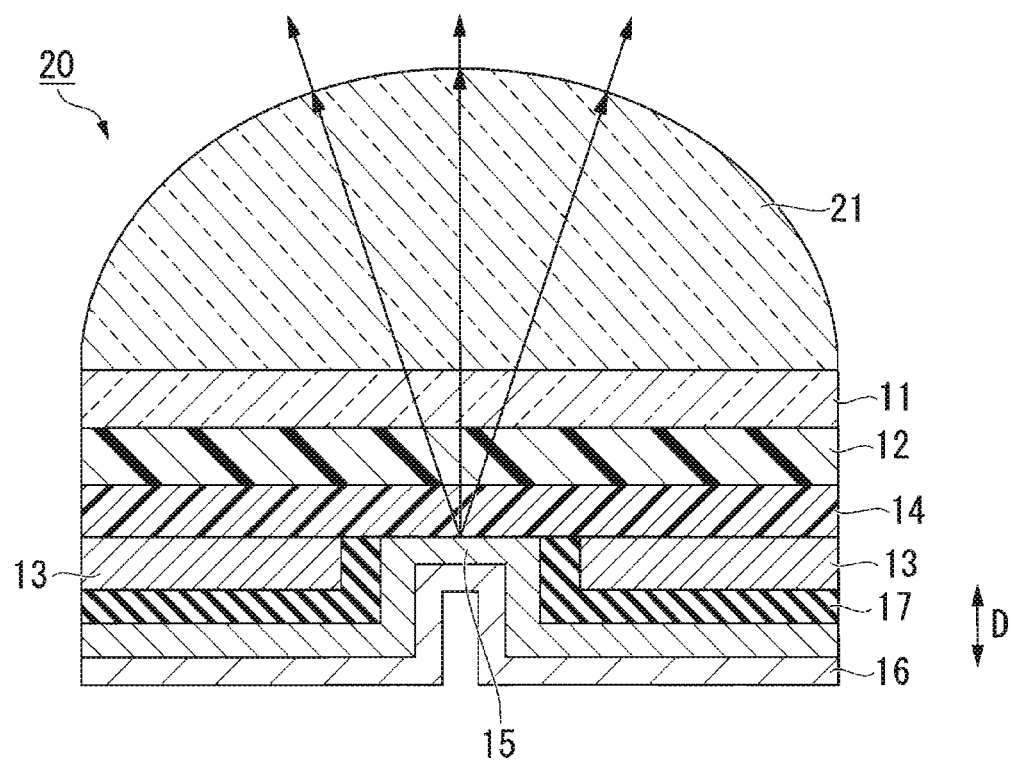
FIG. 17 is a side cross-sectional view illustrating a modification of the lighting device according to the second embodiment of the present invention.

As in a lighting device 20 shown in FIG. 17, a semi-columnar lens 21 may be arranged on the surface of the translucent substrate 11, in alignment with each configuration of the lighting device 10. With this configuration, use efficiency of light can be enhanced.

The second embodiment of the present invention has so far been specifically described with reference to the drawings. However, specific configurations are not limited to this embodiment. Any modifications, combinations and deletions, for example, of the configurations not departing from the spirit of the present invention should be encompassed by the present invention.

The lighting device 10 includes the electrically insulating layer 17. However, for example, the lighting device 10 does not necessarily have to include the electrically insulating layer 17. With this configuration as well, the light emitting element part 15 can emit light by applying a voltage across the transparent anode part 14 and the cathode part 16.

Figure 18:
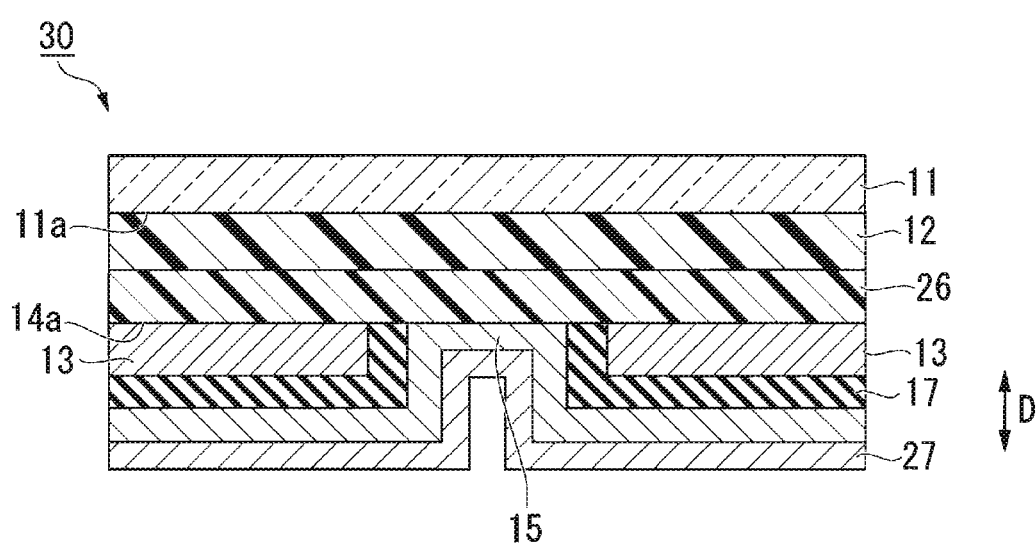
FIG. 18 is a side cross-sectional view illustrating a modification of the lighting device according to the second embodiment of the present invention.

As in a lighting device 30 shown in FIG. 18, in the foregoing embodiment, each configuration of the lighting device 10 may be modified such that the anode and the cathode sandwiching the light emitting element part 15 in the thickness direction D are oppositely provided. Specifically, the lighting device 30 includes a transparent cathode part 26 and an anode part 27 instead of the transparent anode part 14 and the cathode part 16 of the lighting device 1.

Similar to the transparent anode part 14, the transparent cathode part 26 is laminated on the high refractive index layer 12 which is on the opposite side to the surface where the translucent substrate 11 is provided. The transparent cathode part 26 can be formed of the same transparent material as the one used for the transparent anode part 14.

In this example, the light emitting element part 15 is laminated on the electrically conductive light reflection layer 13 which is on the opposite side to the surface where the transparent cathode part 26 is provided.

The anode part 27 is laminated on the light emitting element part 15 which is on the opposite side to the surface where the electrically conductive light reflection layer 13 is provided. The anode part 27 can be formed of the same material as the one used for the cathode part 16.

The lighting device 30 thus configured can also provide advantageous effects similar to those of the lighting device 10 of the second embodiment.

Third Embodiment

Figure 19:
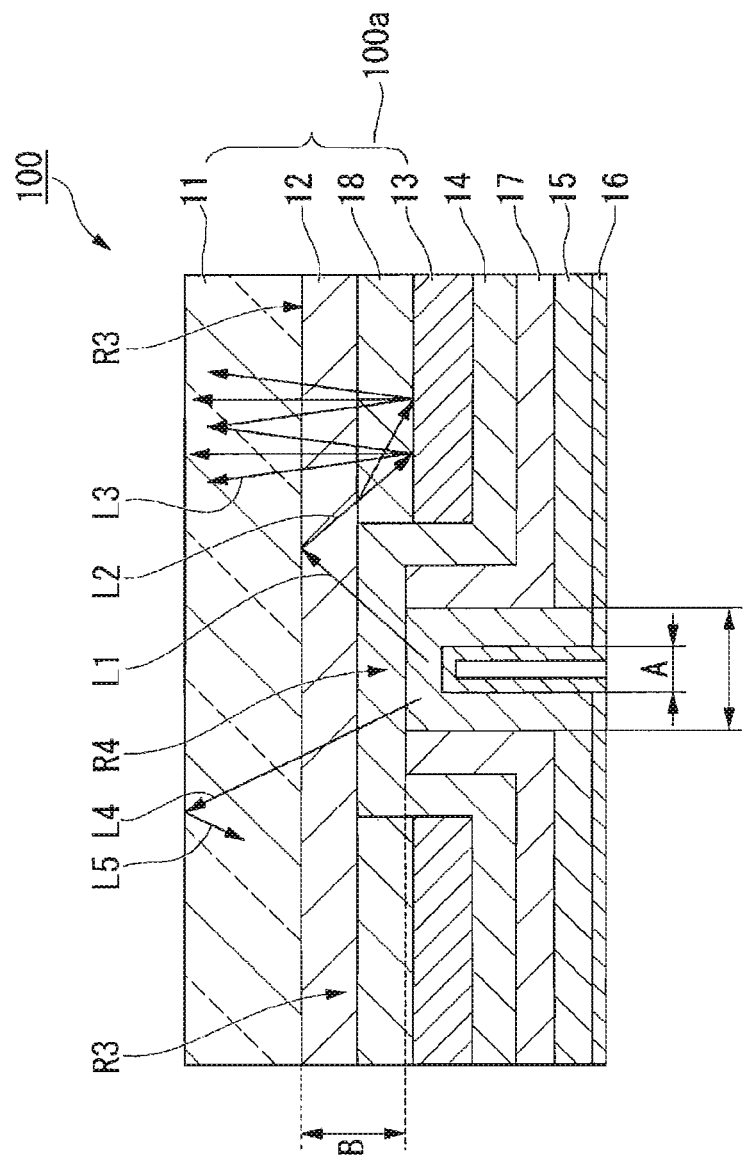
FIG. 19 is a side cross-sectional view illustrating a lighting device according to a third embodiment of the present invention.
Figure 20:
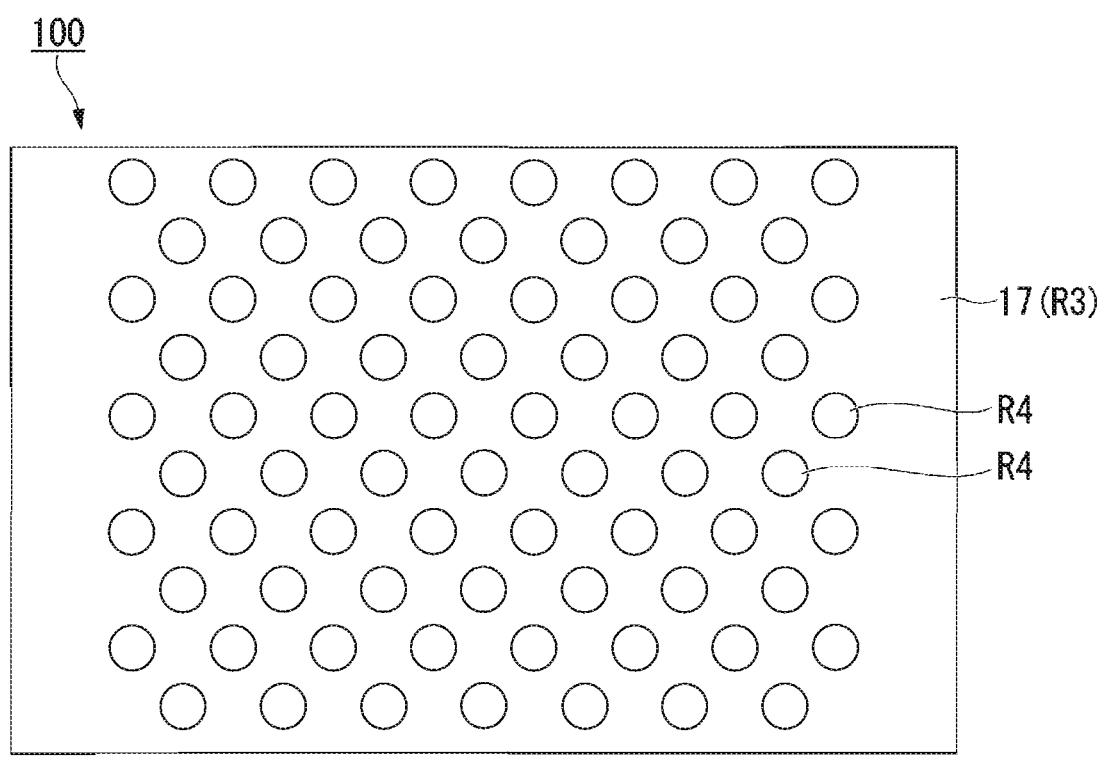
FIG. 20 is a plan view illustrating a layout of a conductive reflection part and openings of the lighting device according to the third embodiment of the present invention.

As shown in FIGS. 19 and 20, a lighting device (organic EL device) 100 according to a third embodiment of the present invention includes a translucent substrate 11, a high refractive index layer 12, a high refraction scattering layer (scattering part) 18, an electrically conductive light reflection layer 13, a transparent anode part 14, an electrically insulating layer 17, a light emitting element part 15, and a cathode part 16. The high refractive index layer 12 is laminated on the translucent substrate 11. The high refraction scattering layer (scattering part) 18 is laminated on a part of the high refractive index layer 12. The electrically conductive light reflection layer 13 is laminated on the high refraction scattering layer 18. The transparent anode part 14 is laminated to cover portions of the high refractive index layer 12 where the high refraction scattering layer (scattering part) 18 is not laminated, opposing side surfaces of the electrically conductive light reflection layer 13 and the high refraction scattering layer, and the electrically conductive light reflection layer 13. The electrically insulating layer 17 is laminated on the transparent anode part 14. The light emitting element part 15 is laminated on the electrically insulating layer 17. The cathode part 16 is laminated on the light emitting element part 15.

As shown in FIGS. 19 and 20, the lighting device 100 has luminous regions R4 from which light is emitted from the light emitting element part 15 and a non-luminous region R3 around the luminous regions R4.

In the present embodiment, the translucent substrate side 11, the high refractive index layer 12, the high refraction scattering layer (the scattering part) 18, and the electrically conductive light reflection layer 13 configure an organic EL device use front plate 100*a*.

It should be noted that components identical with those of the first embodiment are given the same reference signs to omit duplicate description.

In the present embodiment, the transparent anode part 14 is laminated on the high refractive index layer 12 which is on the opposite side to the surface where the translucent substrate 11 is provided. The transparent anode part 14 is laminated covering the surface or laminated on patterned portions, depending on types of organic EL devices. In the present embodiment, the transparent anode part 14 is in contact with the high refractive index layer 12 only in the luminous region R4, described later. In the non-luminous region R3, described later, the high refraction scattering layer (scattering part) 18 or the electrically conductive light reflection layer 13 is laminated between the transparent anode part 14 and the high refractive index layer 12. The present embodiment is different from the first embodiment in that the high refraction scattering layer (scattering part) 18 is provided between the high refractive index layer 12 and the electrically conductive light reflection layer 13.

The high refraction scattering layer (scattering part) 18 is made of a material similarly to the high refractive index layer 12. Fine particles having light scattering properties, described later, can be added to the high refraction scattering layer 18. In this case, the size of the fine particles needs to be made smaller than the thickness of the high refraction scattering layer 18.

Materials that can be used for the scattering fine particles (fine particles) include $TiO_2$, $SiO_2$, $Al_2O_3$, $ZrO$, $CaCO_3$, $BaSO_4$, $Mg_3Si_4O_{10}(OH)_2$, and the like. The particles can have various sizes in the range from tens of nanometers to hundreds of micrometers, for example. However, if the particle size is small, scattering effects are not well exerted. In particular, if the particle size is smaller than 100 nm, sufficient scattering effects are not obtained. A larger size can increase scattering effect more but there is a limit. If a filler with a particle size of 30 μm or more is added, no more scattering effect can be expected. Therefore, the particle size of the scattering fine particles is preferably adjusted to the range of 100 nm to 30 μm.

When the thickness of the high, refraction scattering layer 18 is smaller than 0.5 μm, the size of fine particles that can be added has to be so small that the light scattering properties are degraded, and thus the fine particles do not serve as a light scattering material, which is not favorable.

The high refraction scattering layer (scattering part) 18 is provided only in the non-luminous region R3, described later, but not provided in the luminous region R4.

The present embodiment can be formed such that the high refraction scattering layer 18 is integrated with the high refractive index layer 12, and the non-luminous region R3 and the luminous region R4, described later, are distinguished from each other only based on whether fine particles are contained.

The electrically conductive light reflection layer 13 is formed of Mo (molybdenum), Ni (nickel), Al (aluminum), Ag (silver) or the like, and has electrical conductivity for efficiently conducting electricity and light reflectivity for reflecting light.

The electrically conductive light reflection layer 13 can be prepared by vapor-depositing the above material on the high refractive index layer 12 (the high refraction scattering layer 18). In this case, when the thickness of the electrically conductive light reflection layer 13 is not less than tens of nanometers, light can be intensively reflected. Effects exerted in this case are not only to reflect light but also to decrease the total resistance by the electrically conductive light reflection layer 13 and the transparent anode part 14. Resistance will be more decreased by increasing the thicknesses of the electrically conductive light reflection layer 13 and the transparent anode part 14 in total. However, increase in the thicknesses incurs material cost accordingly. If vapor deposition is used to increase the thickness, there is a limit. Thus, the electrically conductive light reflection layer 13 preferably has an upper limit thickness of about 10 μm. The electrically conductive light reflection layer 13 is formed in a rectangular shape in side view (when viewed from a direction perpendicular to the thickness direction of the translucent substrate 11).

For example, the electrically conductive light reflection layer 13 can have a laminated structure of Mo/Al/Mo laminated from the translucent substrate 11 side. Alternatively, the electrically conductive light reflection layer 13 can have a structure of Al/Mo, Al/Ni, Ag/Mo, or Ag/Ni to provide Al, Ag or the like of high reflectance to the translucent substrate 11 side which is a visual recognition side.

In this case, although Mo has low reflectance, Mo can serve as a barrier layer for the transparent anode part 14 made of ITO or the like, and for the light emitting element part 15.

The electrically conductive light reflection layer 13 can be laminated conforming to the patterned transparent anode part 14, or can be laminated covering the non-luminous region R3.

As shown in FIG. 19, in the lighting device 100 of the present embodiment, the high refraction scattering layer (scattering part) 18 and the electrically conductive light reflection layer 13 are laminated covering the non-luminous region R3 except the luminous regions R4. Thus, when viewed from the surface of the electrically conductive light reflection layer 13 which is on the opposite side to the surface where the translucent substrate 11 is provided, the luminous regions R4 each look like a hole formed in the non-luminous region R3. The hole is specifically a concavity, with the inner wall thereof being formed of two layers, i.e. the high refraction scattering layer (scattering part) 18 and the electrically conductive light reflection layer 13, and with the bottom surface thereof being formed of the high refractive index layer 12. The transparent anode part 14 is laminated covering the inner surface of the concavity and covering the non-luminous region R3 outside the concavity. Other than this, the transparent anode part 14 may be laminated covering the inner surface of the concavity, and may be patterned into a predetermined shape in the non-luminous region R3 outside the concavity.

In the concavity whose inner wall is formed of two layers, i.e. the high refraction scattering layer (scattering part) 18 and the electrically conductive light reflection layer 13, and whose bottom surface is formed of the high refractive index layer 12, the light emitting element part 15 is laminated covering the surface of the transparent anode part 14 inside the concavity, and covering the non-luminous region R3 outside the concavity.

The electrically insulating layer (insulating layer) 17 is laminated covering the light emitting element part 15 in the non-luminous region R3.

The electrically insulating layer 17 serves as a light shielding layer for blocking light, and can be formed of various plastic materials, such as acrylic resins and urethane resins, and inorganic materials. In the case of forming the electrically insulating layer 17 covering the non-luminous region R3, the electrically insulating layer 17 only has to have a thickness of not less than one nanometer to block electricity passed to the transparent electrode 14 (to provide insulation properties). However, when the electrically insulating layer 17 has roughness to some extent, the thickness of the electrically insulating layer 17 has to be increased. The roughness of a primer layer forming the electrically insulating layer 17 also has to be taken into account. If the electrically insulating layer 17 has 10 times the thickness relative to the surface roughness Ra of the primer layer, sufficient electrical insulation properties can be obtained to thereby prevent electrical leakage, for example. This is preferable from the viewpoint of safety.

It should be noted that, as shown in FIG. 20, when viewed in the visually recognizing direction, the region where the electrically insulating layer 17 is laminated serves as the conductive reflection part (non-luminous region) R3 that reflects the light L2, described later. The regions where the electrically insulating layer 17 is not laminated serve as the openings (luminous regions) R4 through which light is emitted from the light emitting element part 15.

As shown in FIG. 20, the luminous regions R4 are formed as islands. A plurality of the luminous regions R4 are arrayed in a hexagonal close-packed pattern at regular intervals. When the opening (luminous region) R4 is in a circular shape, emitted light is efficiently scattered to the high refraction scattering layer (scattering part) 18 in the non-luminous region R3 and extracted, which is favorable, because a high external light-emission efficiency can be obtained. When the openings (luminous regions) R4 are disposed in a hexagonal close-packed pattern, regions in the conductive reflection part (non-luminous region) R3, to which light from the openings (luminous regions) R4 does not reach, can be minimized, which is favorable.

By configuring the luminous regions R4 in this way with the electrically insulating layer 17, each one of the luminous regions R4 can be made less noticeable. Thus, the plurality of openings R4 as a whole can provide emission equivalent to surface emission.

In the present embodiment, the electrically insulating layer 17 is laminated on the surface of the transparent anode part 14 which is on the opposite side to the surface where the electrically conductive light reflection layer 13 is provided in the non-luminous region R3, and laminated over the inner wall surface of the concavity in the transparent anode part 14 formed in the concavity in the luminous region R4. In the case where the transparent anode part 14 is patterned in the non-luminous region R3, the electrically insulating layer 17 is laminated to cover the electrically conductive light reflection layer 13 regardless of whether the transparent anode part 14 is present or not. As a result, the electrically insulating layer 17 is laminated covering the non-luminous region R3. A part of the light emitting element part 15 is directly in contact with the transparent anode part 14 on the bottom surface of the concavity.

The light emitting element part 15 is laminated, via the electrically insulating layer 17, on the transparent anode part 14 which is on the opposite side to the surface where the electrically conductive light reflection layer 13 is provided. In the present embodiment, the light emitting element part 15 is laminated covering the luminous region R4 and the non-luminous region R3.

The cathode part 16 is laminated covering the surface of the light emitting element part 15 in the luminous region R4, the cathode part 16 also being laminated on the light emitting element part 15 which is on the opposite side to the surface where the electrically insulating layer 17 is provided in the non-luminous region R3. Similar to the transparent anode part 14, in the non-luminous region R3, the cathode part 16 is laminated covering the surface or laminated on patterned portions.

As shown in FIG. 19, in the lighting device 100 of the present embodiment, the following relation is ensured to be satisfied:

$$B > (A/2)$$

where B is a thickness from the light emitting element part 15 to the translucent substrate 11 in the luminous region R4 and A is a diameter of the luminous region R4. When these dimensions do not satisfy the relation, there is a high probability that light, which has been totally reflected, again returns to the light emitting element side. In this case, since the reflectance of the device side is low, optical loss is caused accordingly.

In the lighting device 100 thus configured, similar to conventional organic EL devices, the translucent substrate 11, the high refractive index layer 12, the transparent anode part 14, the electrically insulating layer 17, the light emitting element part 15, the cathode part 16, the high refraction scattering layer (scattering part) 18, the electrically conductive light reflection layer 13, and the like can be formed into predetermined patterns by known methods, such as vapor deposition or etching, and can be fabricated by known roll-to-roll processing.

In the following, a method of fabricating the lighting device 100 of the present embodiment will be described.

FIGS. 21A to 24C are cross-sectional views illustrating the process steps of a method of fabricating the lighting device according to the present embodiment.

Figure 21A:
FIG. 21A is a cross-sectional view illustrating a process step of a method of fabricating a lighting device, in the lighting device according to the third embodiment of the present invention.

In the method of fabricating the lighting device 100 according to the present embodiment, first, as shown in FIG. 21A, as a translucent substrate preparation process step, the translucent substrate 11 is prepared. This process step depends on the thickness of the translucent substrate 11. When the thickness is small, roll-to-roll processing can also be selected for fabrication. When the thickness is large, single sheet processing can be used for fabricating organic EL devices located in a plurality of regions.

Figure 21B:
FIG. 21B is a cross-sectional view illustrating a process step of a method of fabricating a lighting device, in the lighting device according to the third embodiment of the present invention.

Subsequently, as shown in FIG. 21B, as a high refractive index layer coating process step, the above-described high refractive index layer 12 is laminated covering the surface of the necessary region on the translucent substrate 11, such as by coating or pasting.

Figure 21C:
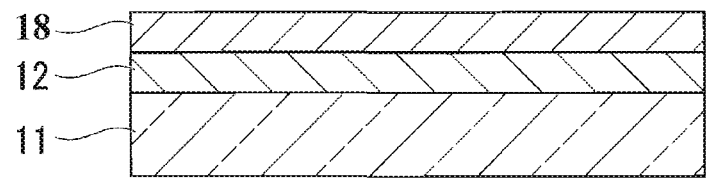
FIG. 21C is a cross-sectional view illustrating a process step of a method of fabricating a lighting device, in the lighting device according to the third embodiment of the present invention.

Subsequently, as shown in FIG. 21C, as a high refraction scattering layer coating process step, the high refraction scattering layer (scattering part) 18 is laminated covering the surface of the necessary region on the surface of the high refractive index layer 12 which is on the opposite side to the surface where the translucent substrate 11 is provided, such as by coating or pasting.

Figure 21D:
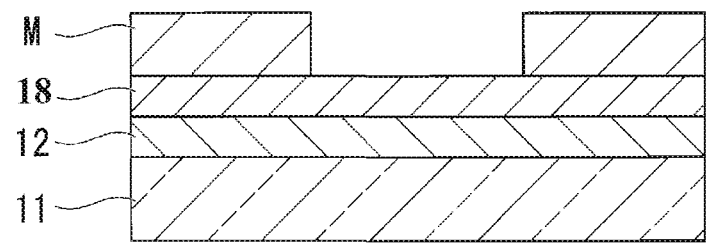
FIG. 21D is a cross-sectional view illustrating a process step of a method of fabricating a lighting device, in the lighting device according to the third embodiment of the present invention.
Figure 21E:
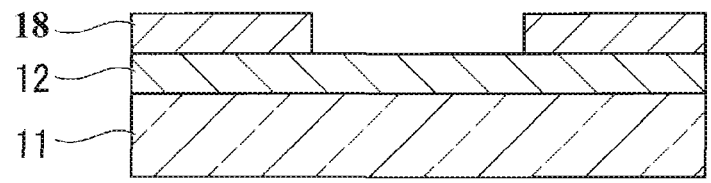
FIG. 21E is a cross-sectional view illustrating a process step of a method of fabricating a lighting device, in the lighting device according to the third embodiment of the present invention.

Subsequently, as shown in FIG. 21D, as a high refraction scattering layer patterning process step, a mask M is formed such as by photolithography on a portion serving as the non-luminous region R3 in the high refractive index layer 12. As shown in FIG. 21E, the high refraction scattering layer (scattering part) 18 is removed only from a portion serving as the luminous region R4 such as by dry etching or wet etching, using the mask M, thereby forming a concavity reaching the high refractive index layer 12.

Figure 22A:
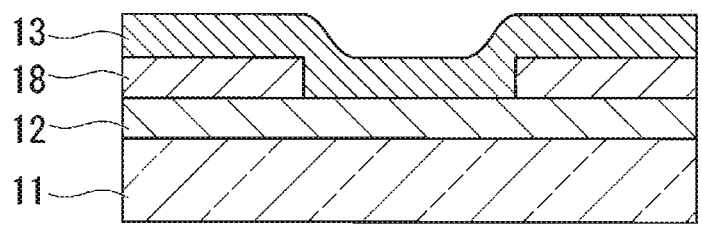
FIG. 22A is a cross-sectional view illustrating a process step of a method of fabricating a lighting device, in the lighting device according to the third embodiment of the present invention.

Subsequently, as shown in FIG. 22A, as an electrically conductive light reflection layer forming process step, the above-described electrically conductive light reflection layer 13 is laminated covering the surfaces of the high refractive index layer 12 and the high refraction scattering layer (scattering part) 18, such as by vapor deposition or sputtering.

Figure 22B:
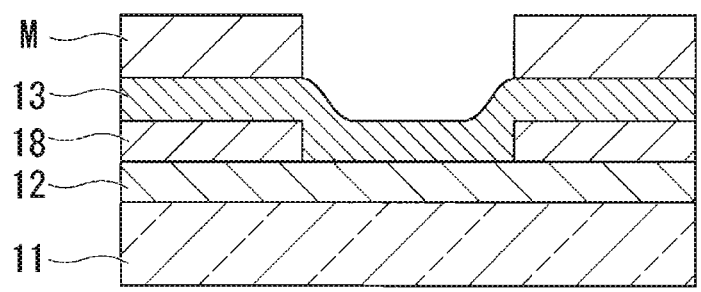
FIG. 22B is a cross-sectional view illustrating a process step of a method of fabricating a lighting device, in the lighting device according to the third embodiment of the present invention.

Subsequently, as shown in FIG. 22B, as an electrically conductive light reflection layer patterning process step, a mask M is formed such as by photolithography on the portion serving as the non-luminous region R3 in the electrically conductive light reflection layer 13. Then, as shown in FIG. 22C, the electrically conductive light reflection layer 13 is removed only from the portion serving as the luminous region R4 such as by dry etching or wet etching, using the mask M, thereby forming a concavity reaching the high refractive index layer 12.

Figure 22C:
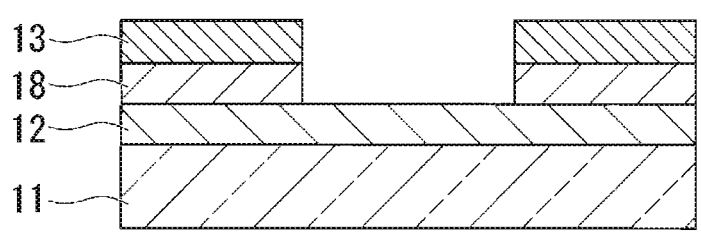
FIG. 22C is a cross-sectional view illustrating a process step of a method of fabricating a lighting device, in the lighting device according to the third embodiment of the present invention.
Figure 22D:
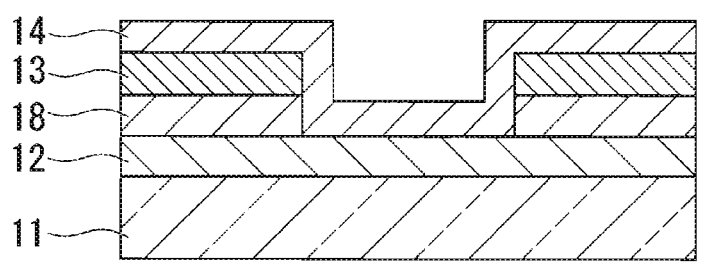
FIG. 22D is a cross-sectional view illustrating a process step of a method of fabricating a lighting device, in the lighting device according to the third embodiment of the present invention.

As shown in FIG. 22C, the mask M is removed. After that, as shown in FIG. 22D, as a transparent anode part forming process step, the transparent anode part 14 is laminated covering the non-luminous region R3 in the high refractive index layer 12 and inside the concavity, such as by sputtering.

Figure 23A:
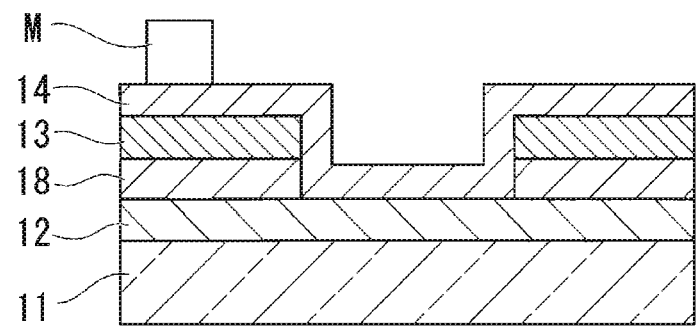
FIG. 23A is a cross-sectional view illustrating a process step of a method of fabricating a lighting device, in the lighting device according to the third embodiment of the present invention.

Subsequently, as shown in FIG. 23A, as a transparent anode part patterning process step, a mask M is formed on a necessary portion on the transparent anode part 14 such as by photolithography. Then, the transparent anode part 14 is patterned and formed into a necessary shape using the mask M such as by dry etching or wet etching.

Figure 23B:
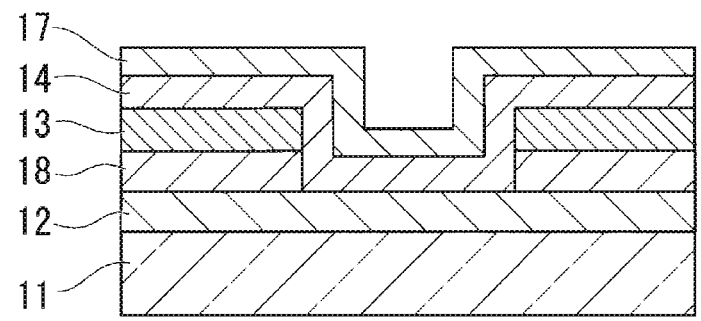
FIG. 23B is a cross-sectional view illustrating a process step of a method of fabricating a lighting device, in the lighting device according to the third embodiment of the present invention.

Subsequently, as shown in FIG. 23B, as an electrically insulating layer forming process step, the electrically insulating layer 17 is laminated covering the surfaces of the transparent anode part 14 and the electrically conductive light reflection layer 13 and inside the concavity serving as the luminous region R4.

Figure 23C:
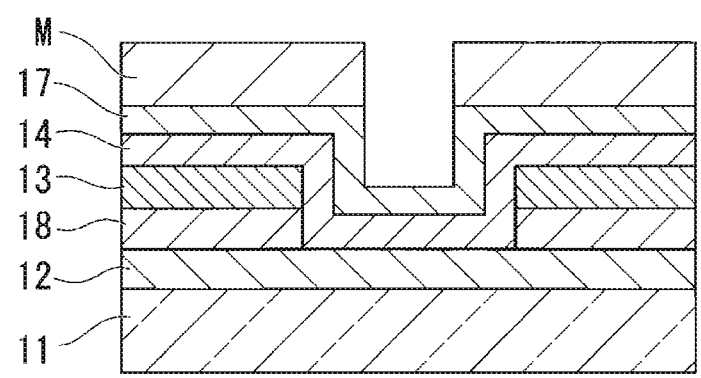
FIG. 23C is a cross-sectional view illustrating a process step of a method of fabricating a lighting device, in the lighting device according to the third embodiment of the present invention.
Figure 24A:
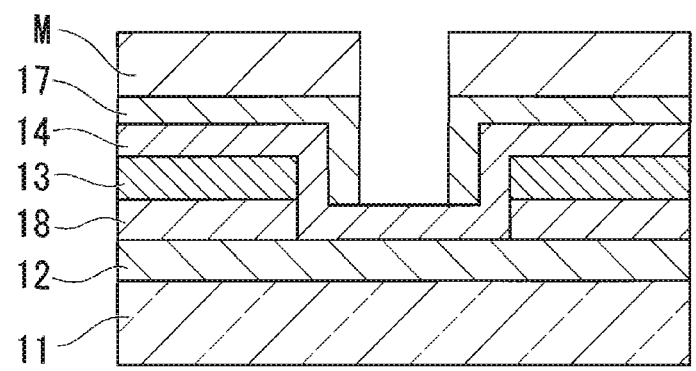
FIG. 24A is a cross-sectional view illustrating a process step of a method of fabricating a lighting device, in the lighting device according to the third embodiment of the present invention.

Subsequently, as shown in FIG. 23C, as an electrically insulating layer patterning process step, a mask M is formed such as by photolithography on the portion serving as the non-luminous region R3 in the electrically insulating layer 17. Then, as shown in FIG. 24A, the electrically insulating layer 17 is removed from only the portion serving as the luminous region R4 such as dry etching or wet etching using the mask M, thereby exposing the transparent anode part 14 in the luminous region R4.

Figure 24B:
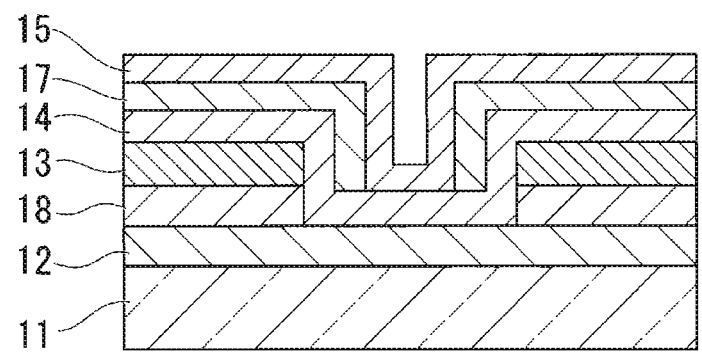
FIG. 24B is a cross-sectional view illustrating a process step of a method of fabricating a lighting device, in the lighting device according to the third embodiment of the present invention.

After removing the mask M, as shown in FIG. 24B, as a light emitting layer forming process step, the light emitting element part 15 is laminated covering the surfaces of the electrically insulating layer 17 and the transparent anode part 14, with the luminous region R4 being exposed, such as by vapor deposition described above.

Figure 24C:
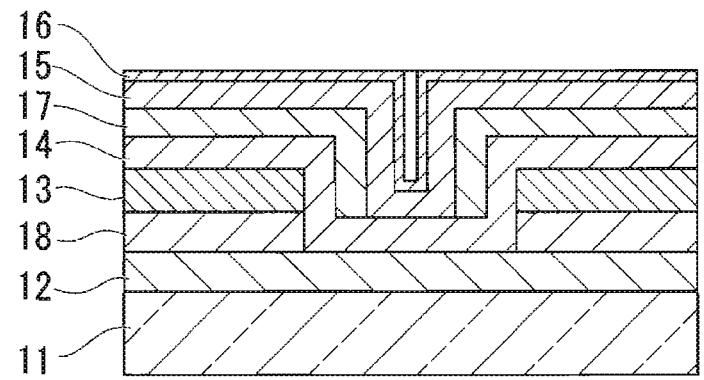
FIG. 24C is a cross-sectional view illustrating a process step of a method of fabricating a lighting device, in the lighting device according to the third embodiment of the present invention.

Subsequently, as shown in FIG. 24C, as a cathode forming process step, the cathode part 16 is laminated covering the surface of the necessary region on the light emitting element part 15, such as by vapor deposition or sputtering. After being patterned such as by photolithography, as necessary, the resultant object is subjected to a final process step, such as sealing, thereby completing the lighting device 100.

The following description sets forth efficient extraction of light in the lighting device 100 configured and fabricated in this way.

Commonly, when the high refractive index layer 12 is not provided, light emitted from the light emitting element part 15 in the luminous region R4 is emitted from the translucent substrate 11 to the outside. In this case, the light is totally reflected off the interface due to the difference in refractive index between the translucent substrate 11 and the internally located transparent anode part 14, to the inner side of the laminate.

Similarly, light emitted from the light emitting element part 15 in the luminous region R4 is totally reflected off the interface due to the difference in refractive index between the translucent substrate 11 and the outside air, to the inner side of the laminate.

In this condition, light fails to be extracted from the organic EL device (lighting device), causing optical loss.

In this regard, as shown in FIG. 19, in the lighting device 100 according to the present embodiment, due to the provision of the high refractive index layer 12, the light L1 emitted from the light emitting element part 15 in the luminous region R4 is totally reflected off the interface between the high refractive index layer 12 and the translucent substrate 11 to become the light L2.

The light L2 hits the electrically conductive light reflection layer 13 while being scattered by the fine particles contained in the high refraction scattering layer (scattering part) 18. Thus, the direction of the light L3 is changed from the direction of the light L1, enabling extraction of the light L2, which should originally have been totally reflected and wasted, from the translucent substrate 11.

To change the direction of the light L3 from the direction of the light L1, the size, density and the like of fine particles (filler) to be added to the high refraction scattering layer (scattering part) 18 can be set to predetermined values.

Similarly, light L4 emitted from the light emitting element part 15 in the luminous region R4 is also totally reflected off the interface due to the difference in refractive index between the translucent substrate 11 and outside air to become light L5. The light L5 also hits the electrically conductive light reflection layer 13 while being scattered by the fine particles contained in the high refraction scattering layer (scattering part) 18. Thus, the direction of the light is changed, enabling extraction of the light L4, which originally would have been totally reflected and wasted, from the translucent substrate 11.

In the lighting device 100 of the embodiment, the surface of the electrically conductive light reflection layer 13 can be roughened to some extent, instead of being flattened, to serve as a scattering part.

Thus, as shown in FIG. 19, the light L2, which has been the light L1 emitted from the light emitting element part 15 in the luminous region R4 and reflected off the interface, hits and is reflected off the surface of the electrically conductive light reflection layer 13 on the transparent anode part 14 side to become the light L3. Being reflected off the electrically conductive light reflection layer 13, the direction of the light L3 is changed from the direction of the light L1, enabling extraction of the light L2, which originally would have been totally reflected and wasted, from the translucent substrate 11. To change the direction of the light L3 from the direction of the light L1, the arithmetic average roughness (Ra) of the surface of the electrically conductive light reflection layer 13 is preferably 100 µm or more but 500 µm or less, for example.

When the surface of the electrically conductive light reflection layer 13 is rougher (arithmetic average roughness is larger), similarly to the high refraction scattering layer (scattering part) 18 shown in FIG. 19, the light L2 scatters on the surface of the electrically conductive light reflection layer 13 to become scattered light L3.

As described above, the performance equivalent to the high refraction scattering layer (scattering part) 18 can be given to the electrically conductive light reflection layer 13. Further, fine particles can be added to the high refractive index layer 12 to have it exerted a scattering effect.

The electrically conductive light reflection layer 13 is disposed covering the non-luminous region R3 and around each luminous region R4 to surround the position where the direction of light discharged from the luminous region R4 is defined. Thus, when the lighting device is visually recognized from outside, although the electrically conductive light reflection layer 13 does not emit light, one feels as if the electrically conductive light reflection layer 13 is luminous and conducting surface emission. By providing the high refraction scattering layer (the scattering part) 18 containing scattering fine particles (fine particles), the effect of better hiding the electrically conductive light reflection layer 13 is exerted as viewed from outside, whether the lighting device 1, such as an organic EL device (a panel), is lit or not. The scattering fine particles contribute to further improve the effect of extracting light from the translucent substrate 11.

The additive amount of scattering fine particles to be contained in the high refraction scattering layer (scattering part) 18 is preferably 40 wt % or less. If the additive amount exceeds 40 wt %, the scattering fine particles agglomerate, which is not favorable. If the additive amount is less than 5 wt %, sufficient scattering effect is not obtained, which is not favorable. Thus, the additive amount of scattering fine particles preferably ranges from 5 wt % to 40 wt %. To increase refractive index, fine particles, such as $ZrO_2$ or $TiO_2$, can be added to control the refractive index.

The sum of thicknesses of the high refractive index layer 12 and the high refraction scattering layer (scattering part) 18 is preferably in a range of 1 to 100 μm. If the sum of thicknesses of the high refractive index layer 12 and the high refraction scattering layer 18 is smaller than 1 μm, the size of the scattering fine particles to be added to the layers has to be smaller than the total thickness. In this case, the size of the fine particles has to be so small that the fine particles do not serve as light scattering materials and degrade light scattering properties, which is not favorable. If the sum of thicknesses is 100 μm or more, the moisture content in the material becomes so large that the light emitting element part 15 is likely to be damaged. In addition, when such scattering fine particles are added, the surface roughness becomes so large that leakage is likely to be caused. Further, when the sum of thicknesses is 100 μm or more, it means that the thickness is too large to serve as a scattering layer, that optical transparency is degraded, which is not favorable.

In the lighting device 100, the ratio of the luminous area to the total area of the light emitting element is defined as an aperture ratio. If the aperture ratio (expressed by: luminous region R4/luminous region R4+non-luminous region R3) is large, luminance of the light emitting element is increased but light-emission efficiency is decreased. On the contrary, if the aperture ratio is small, light-emission efficiency is increased but in-plane luminance is decreased. Thus, it is necessary to determine the aperture ratio, depending on which one of the in-plane luminance and the light-emission efficiency importance is placed on.

In the lighting device 100 of the embodiment, a relation expressed by $B > (A/2)$ is preferably satisfied, where, as shown in FIG. 19, A represents a gap of the light emitting element part 15 across the inner wall of the concavity, and B represents a distance from the light emitting element part 15 contacting the transparent anode part 14 to the translucent substrate 11 in the luminous region R4 (distance from the surface of the light emitting element part 15 contacting the transparent anode part 14 to the surface of the translucent substrate 11 contacting the high refractive index layer). When $B < (A/2)$ is satisfied, light, which has been totally reflected off the glass surface, is highly likely to return again to the light emission surface side. As a result, light extraction efficiency is degraded. The gap A of the light emitting element part 15 can be set as a diameter of the luminous region R4.

If the aperture ratio is decreased, the ratio of the surface area of the electrically conductive light reflection layer 13 is necessarily increased. This exerts an effect of reducing a heat increase in the entire device through transfer of heat at the light emitting element. Accordingly, the lifetime of the lighting device (light emitting elements) 100 can be prolonged.

In the lighting device 100 of the present embodiment, light can be extracted by the scattering caused by the high refraction scattering layer (scattering part) 18. Thus, there is an option of not adding fine particles to the high refractive index layer 12. If scattering fine particles are not added to the high refractive index layer 12, convexities and concavities are not formed by the scattering fine particles in the interface between the high refractive index layer 12 and the transparent anode part 14. Accordingly, the interface between the transparent anode part 14 and the light emitting element part 15 is not roughened due to the influence of the primer layer. Thus, interface between the transparent anode part 14 and the light emitting element part 15 can be easily smoothed, and uniform emission can be obtained, which is favorable.

In this case, the thickness B from the light emitting element part 15 to the translucent substrate 11 in the luminous region R4 and the diameter A of the luminous region R4 are set to satisfy the following relation.

$$B > (A/2)$$

This setting can reduce total reflection of light emitted from the light emitting element part 15 off the interface between the translucent substrate 11 and the high refractive index layer 12, for return to the light emitting element part 15. Thus, light can be efficiently extracted in the non-luminous region R3.

If the high refraction scattering layer 18 is not provided, convexities and concavities as a scattering part may be provided to the interface between the electrically conductive light reflection layer 13 and the high refractive index layer 12 to exert scattering effect.

Since the high refractive index layer 12 is oriented to the light emitting element part side, the surface of the translucent substrate can be made flat. Thus, cleaning is simplified and designing is improved as well.

The configurations of the translucent substrate 11, the high refractive index layer 12, the high refraction scattering layer 18, the electrically conductive light reflection layer 13, the transparent anode part 14, and the like can be fabricated by roll-to-roll processing. Thus, organic material films can be similarly prepared by roll-to-roll processing as well. Conventional fabrication has included preparing a device structure on a glass substrate, forming a light scattering film on a plastic base material, and then bringing the light scattering film into intimate contact with the glass substrate via an adhesive material. In other words, compared with the conventional fabrication, process steps can be simplified, fabrication lead time can be shortened, and cost can be reduced.

Decreasing thickness of the transparent anode part 14 means increasing resistance as an anode.

In many cases, power is supplied to an organic EL device from an end portion of a light emission surface. When power is supplied from an end portion, it is difficult to uniformly keep the current density in the light emitting plane due to voltage drop caused by the resistance of the transparent electrode. Therefore, the light emission quantity around the center of the light emission surface is decreased, degrading in-plane luminous distribution of the light emission surface. To decrease resistance of the anode, the simplest method is to increase the thickness. However, this decreases transmittance of light emitted to the outside, creating a tradeoff relationship.

To decrease resistance of the transparent anode part 14, it is common to additionally perform process steps of crystallizing the transparent anode part 14 by performing annealing at about 200° C. or more. In this case, the substrate to be heated has to withstand the annealing temperature. When an organic material is used for the material of the substrate, the material is likely to be degraded due to the high temperature. In this regard, with the configuration of the present embodiment, the electrically conductive light reflection layer 13, which is used as a light-reflecting material, also contributes to decreasing resistance of the transparent anode part 14. Thus, high-temperature annealing of the transparent anode part 14 is not essential. According to the configuration of the present embodiment, resistance of the anode can be sufficiently reduced without having to perform annealing. Thus, in the configuration of the present embodiment, materials of relatively high resistance, or conductive polymers, such as PEDOT, can be used for the transparent anode part 14, in addition to generally used materials, such as ITO.

Unlike PTL 3, in the configuration of the embodiment, portions provided with an auxiliary interconnection are luminous. Thus, neither luminous portions nor non-luminous portions are created on the light emitting plane of the lighting device. Thus, designing of products is not impaired.

The lighting device 100 of the present embodiment is structured such that the electrically conductive light reflection layer 13 reduces total reflection in the interface between the translucent substrate 11 and the air. The device 100 is not structured to reflect light, which has been totally reflected and returns to the device side, off the cathode side as much as possible, but is structured to reflect the light off the electrically conductive light reflection layer 13. Thus, the light, which has been totally reflected and returned, is prevented from being transmitted through the light emitting element part 15 and absorbed.

In the present embodiment, the electrically conductive light reflection layer 13 has a role of reducing not only reflection of light but also resistance of the transparent anode part 14. The presence of the electrically conductive light reflection layer 13 can contribute to reducing the thickness of the transparent anode part 14 to be as small as possible to reduce the ratio of absorption of light emitted from the light emitting element part 15 of the lighting device 100.

The electrically insulating layer 17 is provided so as to be in intimate contact with the transparent anode part 14 where the electrically conductive light reflection layer 13 is provided. Thus, emission of light, which would have been wasted in inner portions of the electrically conductive light reflection layer 13, can be eliminated. Further, in laminating the light emitting element part 15, there is no need of patterning the light emitting element part 15, and thus fabrication process steps can be simplified.

In this way, in the lighting device 100 of the present embodiment, light extraction efficiency can be improved and at the same time low resistance of the transparent anode part 14 can be maintained.

As described above, the lighting device 100 of the present embodiment serving as an EL device includes the high refractive index layer 12, the high refraction scattering layer 18, and the electrically conductive light reflection layer 13. Thus, if light emitted from the light emitting element part 15 is reflected off the interface of the translucent substrate 11, the light can be re-reflected off the electrically conductive light reflection layer 13. Accordingly, light extraction efficiency of the lighting device 1 is improved and thus light can be efficiently extracted.

The electrically conductive light reflection layer 13 is disposed in the non-luminous region R3 around the luminous region R4. Thus, although the electrically conductive light reflection layer 13 is not luminous itself, when the lighting device 100 is viewed from the translucent substrate 11 side, one feels as if the electrically conductive light reflection layer 13 is luminous. As described above, the lighting device 100 is structured such that light, which is totally reflected and returned to the device side (the light emitting element part 15 side), is reflected off the electrically conductive light reflection layer 13 on the translucent substrate 11 side as much as possible, instead of reflecting the light off the cathode part 16 side of the lighting device 1. Thus, the light, which has been totally reflected and returned, is unlikely to be transmitted through the light emitting element part 15 and absorbed.

Figure 25:
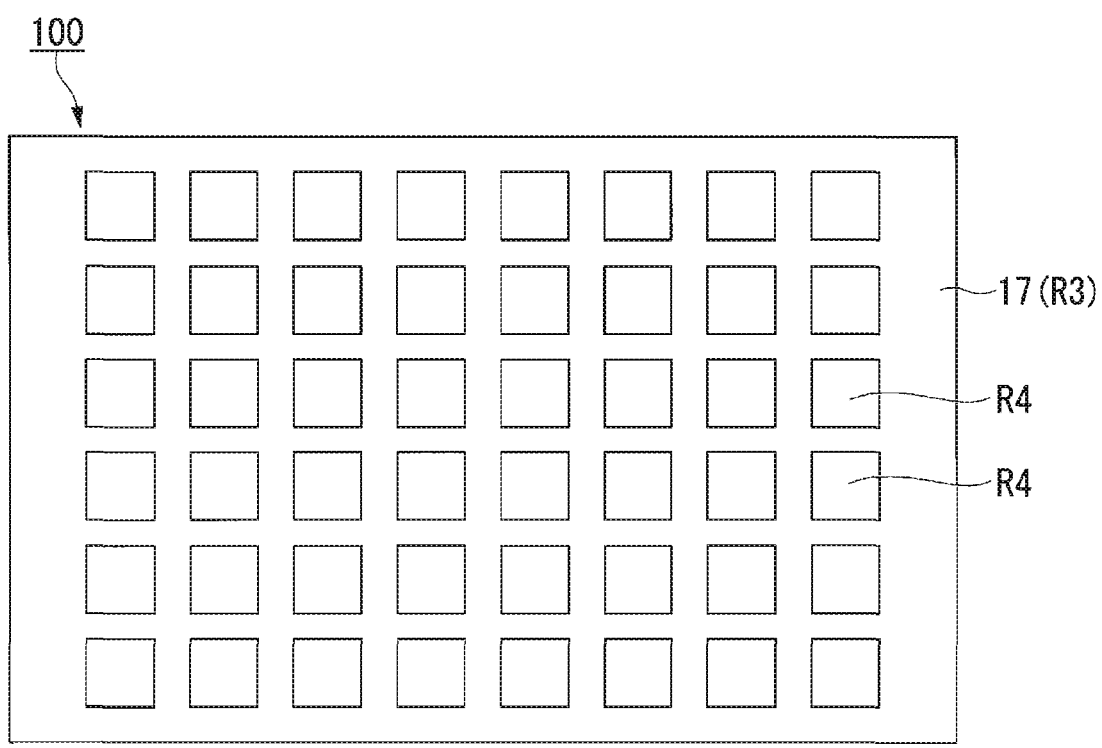
FIG. 25 is a plan view illustrating another layout of a conductive reflection part and openings of the lighting device according to the third embodiment of the present invention.

In the present embodiment, the luminous region R4 is formed in a circular shape in plan view. However, as shown in FIG. 25, the luminous region R4 may be formed in a rectangular shape and disposed in a lattice pattern.

Fourth Embodiment

In the following, referring to the drawings, a lighting device according to a fourth embodiment of the present invention will be described.

Figure 26:
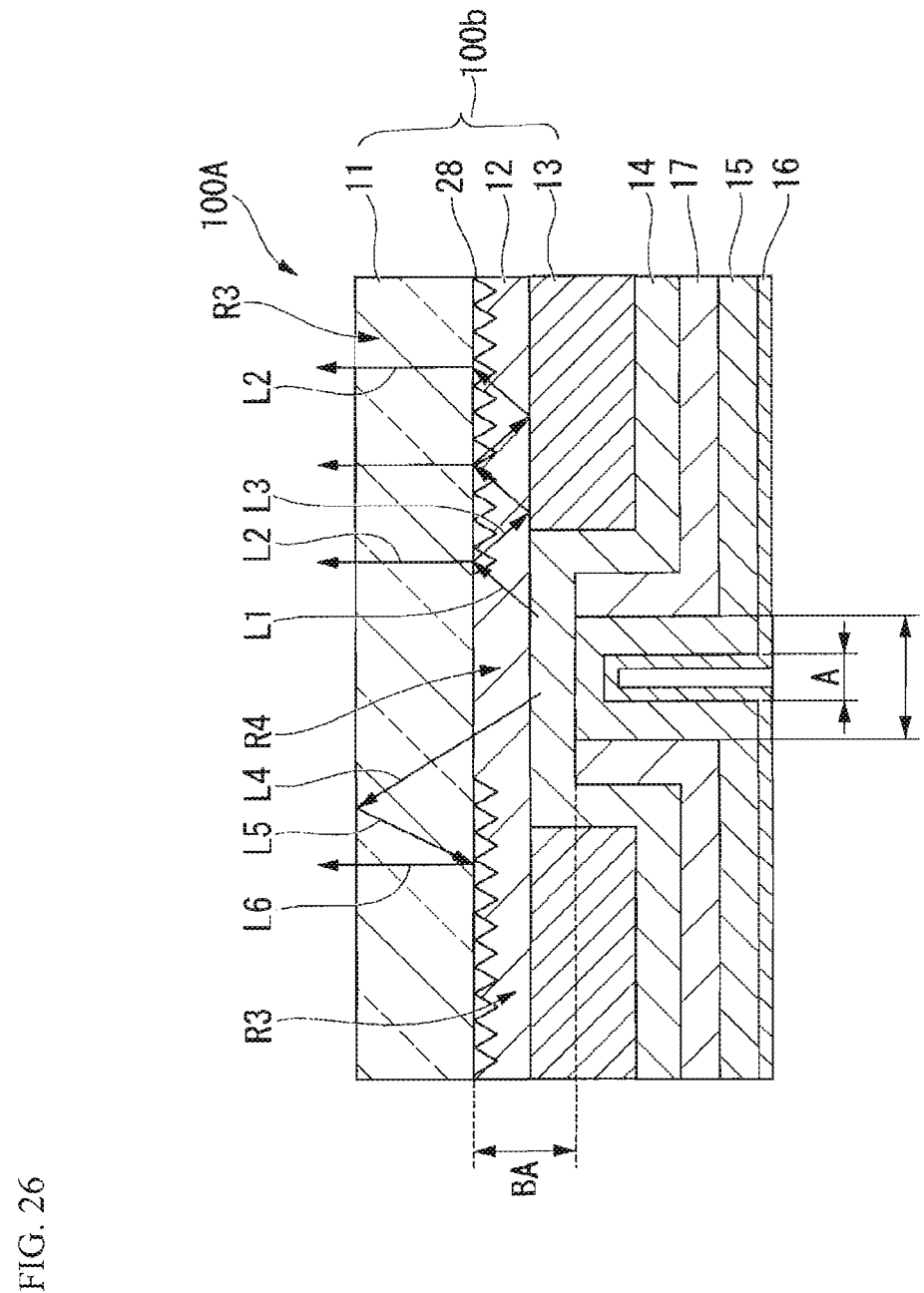
FIG. 26 is a side cross-sectional view illustrating a lighting device according to a fourth embodiment of the present invention.

FIG. 26 is a side cross-sectional view illustrating a lighting device 100A according to the present embodiment.

The present embodiment is different from the third embodiment in respect of a scattering part 28 and a high refraction scattering layer 18. Other corresponding components are given the same reference signs to omit duplicate description.

As shown in FIG. 26, in the lighting device 100A of the present embodiment, the high refraction scattering layer 18 is not provided. Instead, a micro-concavo-convex structure (scattering part) 28 is provided on a high refractive index layer 12 on the translucent substrate 11 side to serve as a non-luminous region R3 (on the surface of the high refractive index layer 12 contacting the translucent substrate 11).

The translucent substrate side 11, the high refractive index layer 12, the micro-concavo-convex structure (scattering part) 28, and an electrically conductive light reflection layer 13 configure an organic EL device use front plate 100b.

The micro-concavo-convex structure (scattering part) 28 can be in a microlens shape (e.g., hemispherical or elliptically hemispherical shape) with an outer diameter of about 0.1 μm to 500 μm, a quadrangular pyramid shape, or a shape spangled with micro particles, for example.

All of these micro-concavo-convex structures aim to change the direction of scattering light and extract light emitted inside the lighting device 100A from the translucent substrate 11. The refractive index of the micro-concavo-convex structure (scattering part) 28 can be made lower than that of the high refractive index layer 12.

By providing the micro-concavo-convex structure on the translucent substrate 11, light emission angle and light extraction efficiency can be controlled.

Part of the light emitted from a light emitting element part 15 in the luminous region R4 is applied, as light L1, to the non-luminous region R3. The direction of the light L1 is changed to the direction of light L2 by the micro-concavo-convex structure (scattering part) 28 located in the interface between the high refractive index layer 12 and the translucent substrate 11. Thus, the light L1, which would have originally been totally reflected and wasted, can be extracted from the translucent substrate 11.

Light L3, which has been reflected off the interface between the high refractive index layer 12 and the translucent substrate 11, is reflected off the interface between the high refractive index layer 12 and the electrically conductive light reflection layer 13, and is again incident on the micro-concavo-convex structure (scattering part) 28. The direction of the light L2 is then changed by the micro-concavo-convex structure (scattering part) 28, and can be extracted from the translucent substrate 11.

As shown in FIG. 26, BA indicates a distance from the light emitting element part 15 contacting the transparent anode part 14 to the translucent substrate 11 in the luminous region R4 (distance from the surface of the light emitting element part 15 contacting the transparent anode part 14 to the surface of the translucent substrate 11 contacting the high refractive index layer). In the present embodiment, the distance BA can be made shorter than the distance B of FIG. 19. Thus, if the aperture ratio is increased, i.e. the diameter A of the luminous region R4 is increased, a relation BA>(A/2) can be easily retained. Therefore, if the diameter A of the luminous region R4 remains unchanged, B<(A/2) will not be established, with which the light incident on the non-luminous region R3 has a high probability of returning again to the light emission surface side. As a result, degradation of light extraction efficiency can be prevented. Accordingly, the aperture ratio can be increased to thereby increase light emission quantity.

At the same time, by setting the distance BA, light distribution angle can be controlled as well.

The following description addresses a method of fabricating the lighting device 100A according to the present embodiment.

FIGS. 27A to 29C are cross-sectional views illustrating process steps performed in a method of fabricating the lighting device 100A according to the present embodiment.

Figure 27A:
FIG. 27A is a cross-sectional view illustrating a process step of a method of fabricating a lighting device, in the lighting device according to the fourth embodiment of the present invention.

In the method of fabricating the lighting device 100A according to the present embodiment, as shown in FIG. 27A, first, as a translucent substrate preparation process step, the translucent substrate 11 is prepared. When the thickness of the translucent substrate 11 is small, roll-to-roll processing can also be selected for fabrication. When the thickness of the translucent substrate 11 is large, single sheet processing can be used for fabricating organic EL devices located in a plurality of regions.

Figure 27B:
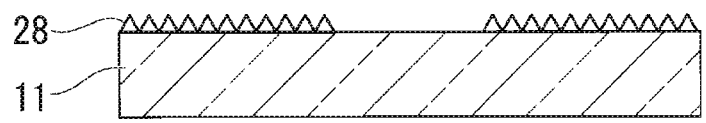
FIG. 27B is a cross-sectional view illustrating a process step of a method of fabricating a lighting device, in the lighting device according to the fourth embodiment of the present invention.

Subsequently, as shown in FIG. 27B, as a micro-concavo-convex structure forming process step, a resin film, on which the micro-concavo-convex structure (scattering part) 28 has been formed, is attached to the translucent substrate 11 serving as the non-luminous region R3. Alternatively, a resin layer is coated onto the substrate and then shaped into the concavo-convex structure (scattering part) 28.

Figure 27C:
FIG. 27C is a cross-sectional view illustrating a process step of a method of fabricating a lighting device, in the lighting device according to the fourth embodiment of the present invention.

Subsequently, as shown in FIG. 27C, as a high refractive index layer coating process step, the high refractive index layer 12 is laminated covering the surface of the necessary region on the translucent substrate 11, on which the concavo-convex structure (scattering part) 28 has been formed, such as by coating or pasting.

Figure 27D:
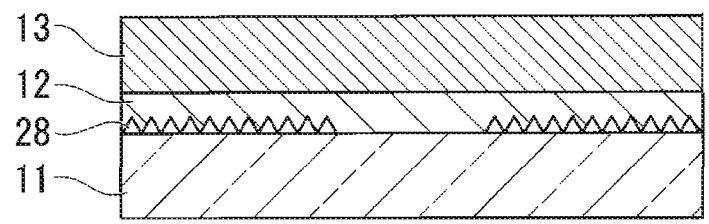
FIG. 27D is a cross-sectional view illustrating a process step of a method of fabricating a lighting device, in the lighting device according to the fourth embodiment of the present invention.

Subsequently, as shown in FIG. 27D, as an electrically conductive light reflection layer forming process step, the electrically conductive light reflection layer 13 is laminated covering the surface of the high refractive index layer 12, such as by vapor deposition or sputtering.

Figure 27E:
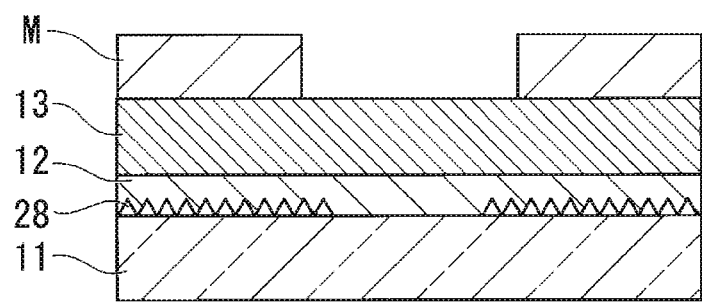
FIG. 27E is a cross-sectional view illustrating a process step of a method of fabricating a lighting device, in the lighting device according to the fourth embodiment of the present invention.
Figure 28A:
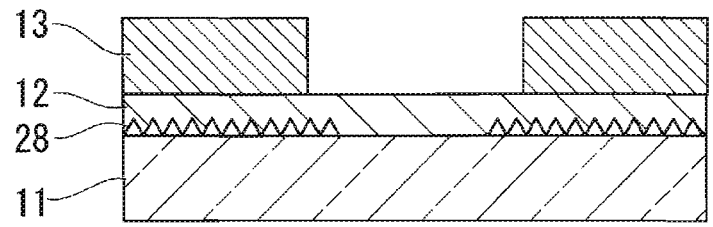
FIG. 28A is a cross-sectional view illustrating a process step of a method of fabricating a lighting device, in the lighting device according to the fourth embodiment of the present invention.

Subsequently, as shown in FIG. 27E, as an electrically conductive light reflection layer patterning process step, a mask M is formed, such as by photolithography, on a portion serving as the non-luminous region R3 in the electrically conductive light reflection layer 13. Then, as shown in FIG. 28A, the electrically conductive light reflection layer 13 is removed only from a portion serving as the luminous region R4 such as by dry etching or wet etching, using the mask M, thereby forming a concavity reaching the high refractive index layer 12.

Figure 28B:
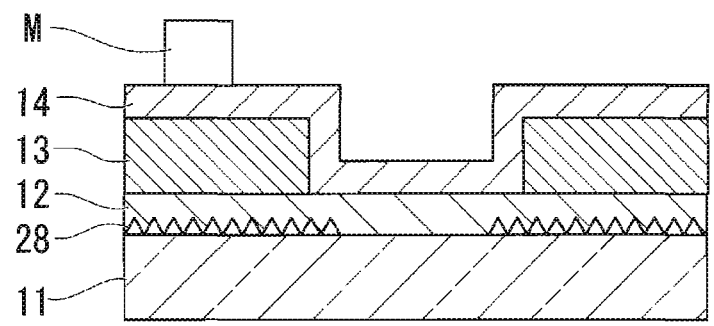
FIG. 28B is a cross-sectional view illustrating a process step of a method of fabricating a lighting device, in the lighting device according to the fourth embodiment of the present invention.

After the mask M is removed, as shown in FIG. 28B, as a transparent anode part forming process step, the transparent anode part 14 is laminated covering the non-luminous region R3 in the electrically conductive light reflection layer 13 and the high refractive index layer 12 inside the concavity, such as by sputtering.

Subsequently, as shown in FIG. 28B, as a transparent anode part patterning process step, a mask M is formed on a necessary portion on the transparent anode part 14 such as by photolithography. Then, the transparent anode part 14 is patterned into a necessary shape such as dry etching or wet etching using the mask M.

Figure 28C:
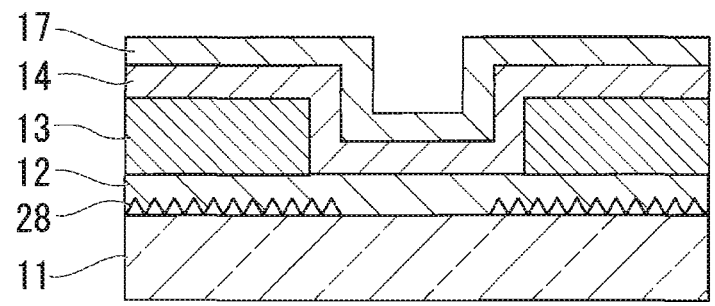
FIG. 28C is a cross-sectional view illustrating a process step of a method of fabricating a lighting device, in the lighting device according to the fourth embodiment of the present invention.

Subsequently, as shown in FIG. 28C, as an electrically insulating layer forming process step, the electrically insulating layer 17 is laminated covering the surfaces of the transparent anode part 14, the electrically conductive light reflection layer 13 and inside the concavity serving as the luminous region R4.

Figure 28D:
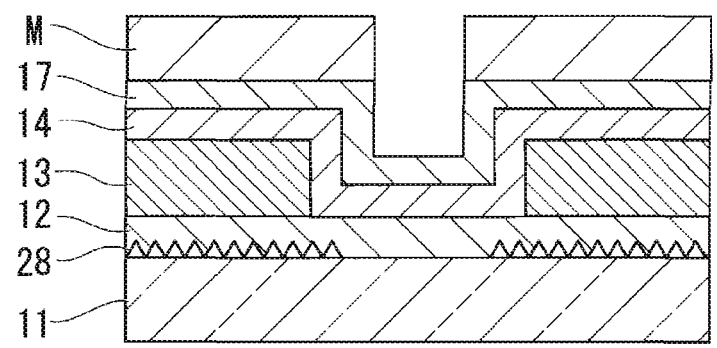
FIG. 28D is a cross-sectional view illustrating a process step of a method of fabricating a lighting device, in the lighting device according to the fourth embodiment of the present invention.
Figure 29A:
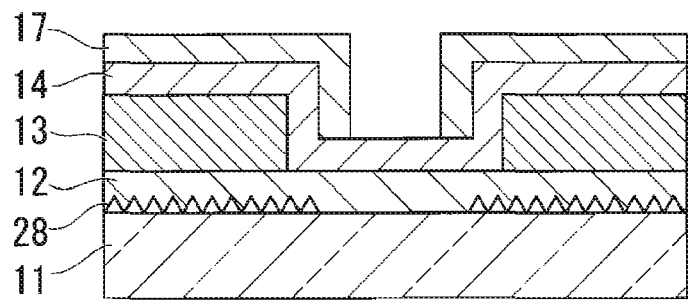
FIG. 29A is a cross-sectional view illustrating a process step of a method of fabricating a lighting device, in the lighting device according to the fourth embodiment of the present invention.

Subsequently, as shown in FIG. 28D, as an electrically insulating layer patterning process step, a mask M is formed on the portion serving as the non-luminous region R3 in the electrically insulating layer 17, such as by photolithography. As shown in FIG. 29A, the electrically insulating layer 17 is removed from only the portion serving as the luminous region R4 such as by dry etching or wet etching using the mask M, thereby exposing the transparent anode part 14 in the luminous region R4.

Figure 29B:
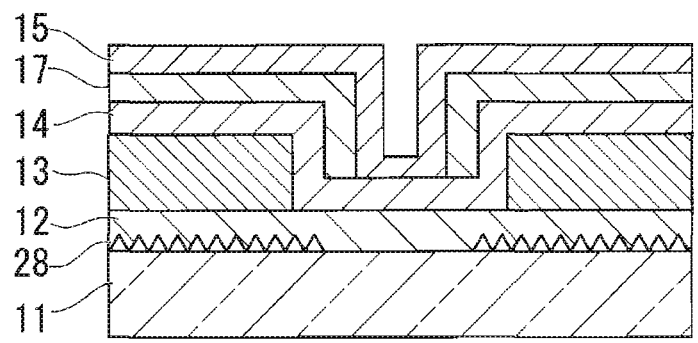
FIG. 29B is a cross-sectional view illustrating a process step of a method of fabricating a lighting device, in the lighting device according to the fourth embodiment of the present invention.

After removing the mask M, as shown in FIG. 29B, as a light emitting layer forming process step, the light emitting element part 15 is laminated covering the surfaces of the electrically insulating layer 17 and the transparent anode part 14, with the luminous region R4 being exposed, such as by vapor deposition described above.

Figure 29C:
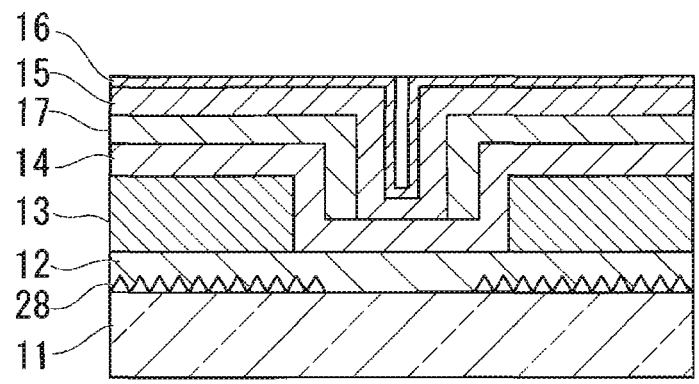
FIG. 29C is a cross-sectional view illustrating a process step of a method of fabricating a lighting device, in the lighting device according to the fourth embodiment of the present invention.

Subsequently, as shown in FIG. 29C, as a cathode forming process step, the cathode part 16 is laminated covering the necessary region on the light emitting element part 15, such as by vapor deposition or sputtering. After being patterned such as by photolithography as necessary, the resultant object is subjected to a final process step, such as sealing, thereby completing the lighting device 100A.

The lighting device 100A of the present embodiment has advantageous effects similar to those of the third embodiment. At the same time, the lighting device 100A can decrease the thicknesswise distance between the translucent substrate 11 and the electrically conductive light reflection layer 13 to increase light which is incident on the concavo-convex structure (scattering part) 28. Thus, light extraction efficiency can be further enhanced.

Fifth Embodiment

Referring to the drawings, a lighting device according to a fifth embodiment of the present invention will be described.

Figure 30:
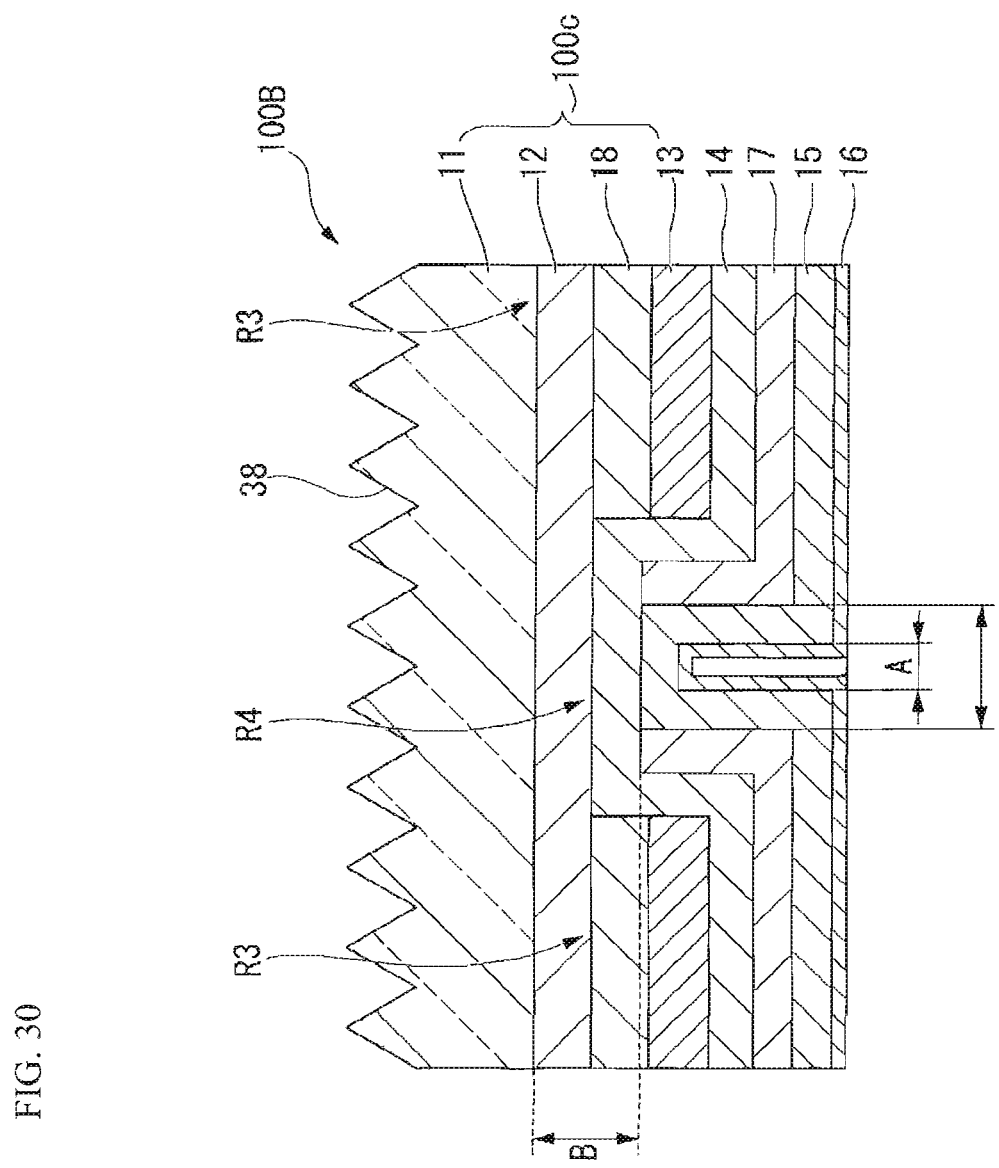
FIG. 30 is a side cross-sectional view illustrating a lighting device according to a fifth embodiment of the present invention.

FIG. 30 is a side cross-sectional view illustrating a lighting device 100B according to the present embodiment.

The present embodiment is provided with a scattering part 38 which is different from the third embodiment. Other corresponding components are given the same reference signs to omit duplicate description.

As shown in FIG. 30, in the lighting device 100B of the present embodiment, the micro-concavo-convex structure (scattering part) 38 is provided covering the luminous region R4 and the non-luminous region R3, on the surface of a translucent substrate side 11 on the visual recognition side (on the surface of the translucent substrate 11 which is on the opposite side to the surface where the high refractive index layer 12 is provided).

The translucent substrate side 11, the high refractive index layer 12, the high refraction scattering layer (scattering part) 18, the micro-concavo-convex structure (scattering part) 38, and the electrically conductive light reflection layer 13 configure an organic EL device use front plate 100c.

The micro-concavo-convex structure (scattering part) 38 can be in a microlens shape (e.g., hemispherical or elliptically spherical shape) with an outer diameter of about 0.1

μm to 500 μm, a quadrangular pyramid shape, or a shape spangled with micro particles, for example.

All of these micro-concavo-convex structures aim to change the direction of scattering light and extract light emitted inside the lighting device 100B from the translucent substrate 11. The refractive index of the micro-concavo-convex structure (scattering part) 38 can be made lower than that of the high refractive index layer 12.

Since the micro-concavo-convex structure is provided on the translucent substrate 11, light emission angle and light extraction efficiency can be controlled.

The foregoing embodiments each deal with the case where the present invention is applied to a lighting device. However, the present invention may be applied to display devices, such as monitors. In this case, a TFT substrate that is a substrate having thin film transistors may be used as the translucent substrate 11. Further, the light emitting element part may be patterned in high definition to emit red (R) light, green (G) light, and blue (B) light, for example.

EXAMPLES

By way of examples, the present invention will be more specifically described. However, the present invention should not be construed as being limited to these examples.

Example 1

Based on the first embodiment, the pitch of the light emitting layer of the lighting device was 200 μm (the pitch corresponds to the pitch between the adjacent light emitting parts 15a of the light emitting element part 15 in FIG. 1. In FIG. 1, only one light emitting part 15a is shown.), and the thickness of the high refractive index layer was 10 μm. ITO was used for the transparent anode part. The transparent anode part was formed with a thickness of 150 nm using known sputtering. The high refractive index layer was formed on a PET film with a thickness of 188 μm. As a measure against moisture permeation, the surface of the PET film which is on the opposite side to the surface to be provided with the high refractive index layer was stuck to a glass surface by means of a transparent adhesive film.

Figure 31:
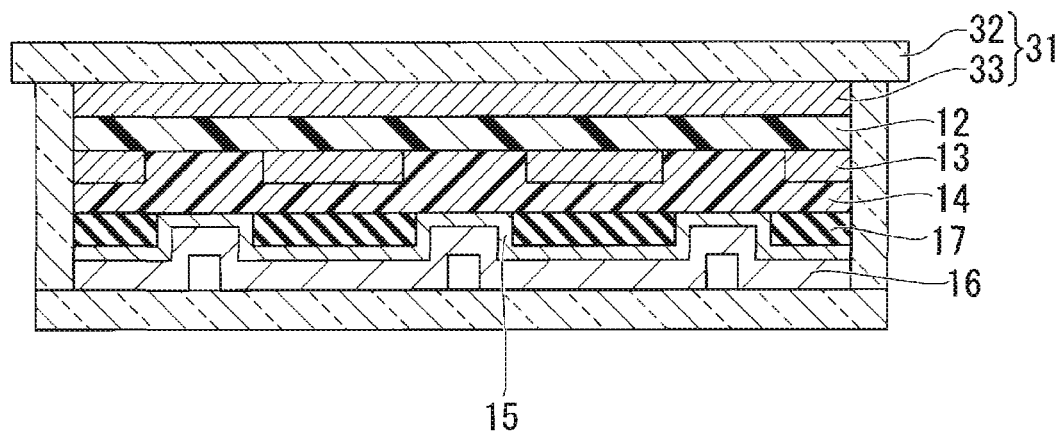
FIG. 31 is a side cross-sectional view illustrating a lighting device according to example 1 of the present invention.

As shown in FIG. 31, in the present example, a translucent substrate 31 was configured of a glass substrate 32 and a PET film 33. The refractive index of the high refractive index layer was 1.7, and the thickness of the electrically conductive light reflection layer was 3 μm. Fine particles having light scattering properties were added by 20 w % to the high refractive index layer. The fine particles were composed of $SiO_2$ and had a particle size of 2.0 μm.

Aluminum for use as the electrically conductive light reflection layer was deposited on the high refractive index layer.

In the device structure, α-npd with a thickness of 70 nm, Alq3 with a thickness of 60 nm, and Al as the cathode part with a thickness of 100 nm were formed on ITO serving as the transparent anode part. Compared with a reference (comparative example) that was simply prepared on glass, an improvement in efficiency to about 1.9 times the efficiency of the reference was confirmed.

Example 2

Figure 32:
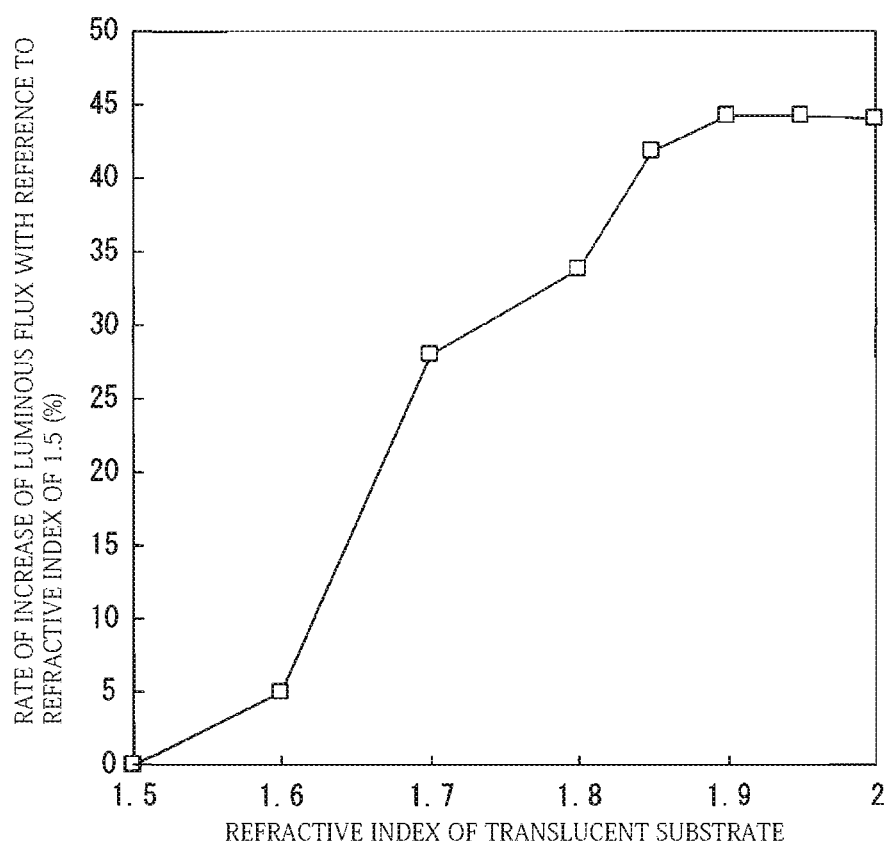
FIG. 32 is a diagram illustrating changes in luminous flux due to refractive index of a translucent substrate of a lighting device according to example 2 of the present invention.

Based on the first embodiment, α-npd with a thickness of 70 nm, Alq3 with a thickness of 60 nm and Al as the cathode part with a thickness of 100 nm were formed on ITO serving as the transparent anode part. FIG. 32 is a graph simulating luminous flux entering into the translucent substrate when the refractive index of the translucent substrate is set in the range of 1.5 to 2.0.

The graph in FIG. 32 shows the rate of increase of luminous flux when the refractive index of the translucent substrate is changed with reference to the translucent substrate having a refractive index 1.5. As can be seen, when the refractive index becomes 1.7, the luminous flux extremely increases compared with when the refractive index is 1.6. It will be understood from this that, when the refractive index of the translucent substrate is 1.7 or more, a larger quantity of luminous flux is extracted from inside the translucent substrate.

Example 3

Based on the second embodiment, the pitch of the light emitting layer of the lighting device was 200 μm (the pitch corresponds to the pitch between the adjacent light emitting parts 15a of the light emitting element part 15 in FIG. 10. In FIG. 10, only one light emitting part 15a is shown.), and the thickness of the high refractive index layer was 10 μm. ITO was used for the transparent anode part. The transparent anode part was formed with a thickness of 150 nm using a known sputtering technique. The high refractive index layer was formed on a PET film with a thickness of 188 μm. As a measure against moisture permeation, the surface of the PET film which is on the opposite side to the surface to be provided with the high refractive index layer was stuck to a glass surface by means of a transparent adhesive film.

Figure 33:
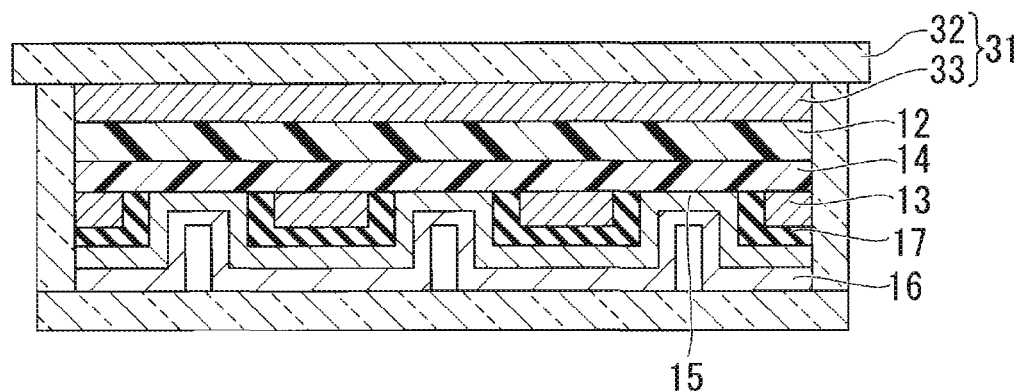
FIG. 33 is a side cross-sectional view illustrating a lighting device according to example 3 of the present invention.

As shown in FIG. 33, in the present example, a translucent substrate 31 was configured of a glass substrate 32 and a PET film 33. The refractive index of the high refractive index layer was 1.7, and the thickness of the electrically conductive light reflection layer was 3 μm. Fine particles having light scattering properties were added by 20 w % to the high refractive index layer. The fine particles were composed of $SiO_2$ and had a particle size of 2.0 μm.

Aluminum for use as the electrically conductive light reflection layer was deposited on the high refractive index layer.

In the device structure, α-npd with a thickness of 70 nm, Alq3 with a thickness of 60 nm, and Al as the cathode part with a thickness of 100 nm were formed on ITO serving as the transparent anode part. Compared with a reference (comparative example) that was simply prepared on glass, an improvement in efficiency to about 1.5 times the efficiency of the reference was confirmed.

Example 4

Figure 34:
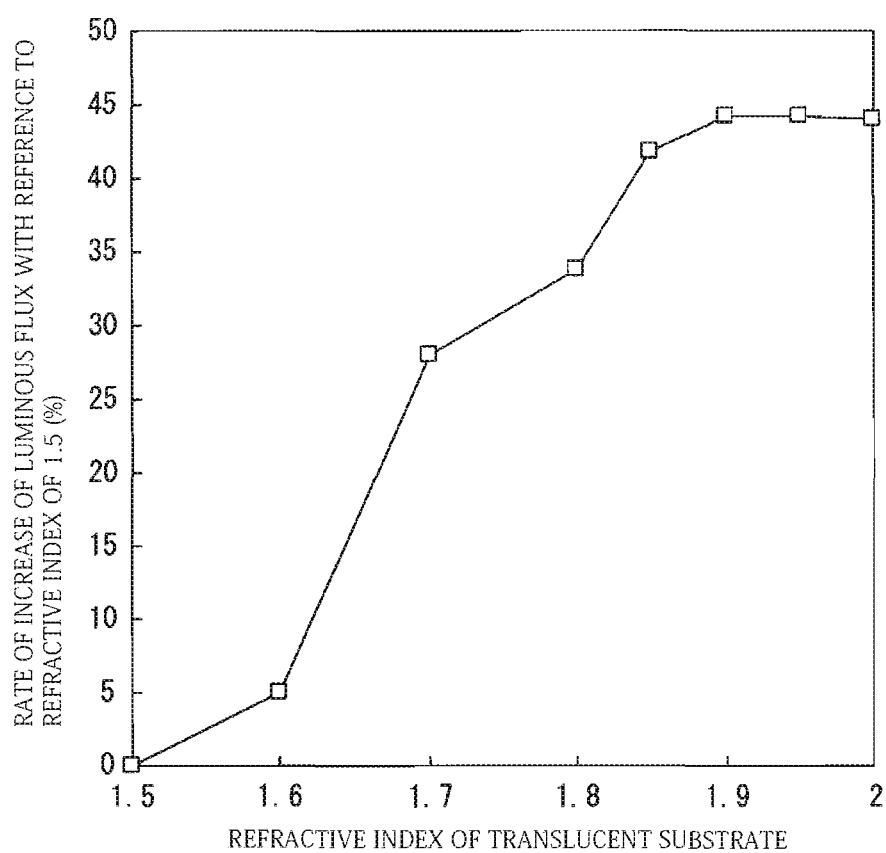
FIG. 34 is a diagram illustrating changes in luminous flux due to refractive index of a translucent substrate of a lighting device according to example 4 of the present invention.

Based on the second embodiment, α-npd with a thickness of 70 nm, Alq3 with a thickness of 60 nm and Al as the cathode part with a thickness of 100 nm were formed on ITO serving as the transparent anode part. FIG. 34 is a graph simulating luminous flux entering into the translucent substrate when the refractive index of the translucent substrate is set in the range of 1.5 to 2.0.

The graph shows the rate of increase of luminous flux when the refractive index of the translucent substrate is changed with reference to the translucent substrate having a refractive index 1.5. As can be seen, when the refractive index becomes 1.7, the luminous flux greatly increases compared with when the refractive index is 1.6. It will be understood from this that, when the refractive index of the translucent substrate is 1.7 or more, a larger quantity of luminous flux is extracted from inside the translucent substrate.

Example 5

Based on the third embodiment, the lighting device 100 shown in FIG. 19 was prepared, in which the pitch of the light emitting element part 15, or a gap between the adjacent light emitting element parts 15, was 200 μm, the diameter A of the luminous region R4 was 10 μm, and the distance B from the light emitting element part 15 to the translucent substrate 11 was 10 μm.

ITO was used for the transparent anode part 14, and a film was formed by 150 nm sputtering. The high refractive index layer 12 was formed on a 188 μm PET film. As a measure against moisture permeation, the surface of the PET film which is on the opposite side to the surface where the high refractive index layer 12 was provided was stuck onto a glass surface by means of a transparent adhesive film.

In example 5, the translucent substrate 11 is formed of a glass substrate and PEN. The refractive index of the high refractive index layer 12 was 1.7, and the thickness of the electrically conductive light reflection layer 13 was 3 μm.

As the high refraction scattering layer 18, 20 w % of $SiO_2$ scattering particles with a particle size of 2.0 μm were added to the high refractive index layer 12.

Aluminum for use as the electrically conductive light reflection layer 13 was deposited on the high refractive index layer 12 side.

In the device structure, α-npd of 70 nm, Alq3 of 60 nm, and Al of 100 nm were formed on ITO.

In example 5, compared with a reference (comparative example) that was simply prepared on glass, an improvement in efficiency to about 1.9 times the efficiency of the reference was confirmed.

PTL 1 describes an example of externally attaching a film to a substrate. In the disclosure of PTL 1, the total reflection of light is reduced in the interface between the substrate and an air layer, thus improving light extraction efficiency. In extracting light using an externally provided film, PTL 1 makes use of retroreflection between the surface of a light scattering film and a cathode part, which is made such as of aluminum or silver, to increase light extraction efficiency of the light scattering film. On the other hand, there is a problem that, in retroreflection, light is absorbed by a transparent anode part, a light emitting element part, and a cathode, causing optical loss. As mentioned above, the difference in refractive index between the organic layer and the substrate is not taken into account in improving light extraction efficiency, which means that light extraction efficiency is not sufficient.

PTL 2 describes a method in which a mother die is used to provide convexities and concavities to thereby reduce the difference in refractive index between an organic layer and a substrate. However, similar to PTL 1, also in PTL 2, there is a problem that in retroreflection, light is absorbed by a transparent anode part, a light emitting element part, and a cathode, resulting in optical loss. Also, the concave-convex structure formed extending to the organic layer often causes leakage or short circuiting between the anode and the cathode. As a result, productivity is disadvantageously degraded.

PTL 3 describes a method of providing an auxiliary interconnection for decreasing resistance of a transparent anode part made such as of ITO. In PTL 3, the resistance of the anode is designed to be decreased using the auxiliary interconnection. However, in a typical configuration, portions in which the auxiliary interconnection is provided are not luminous. Thus, luminous regions and non-luminous regions are unavoidably formed in the light emitting plane of a lighting device, degrading product design.

Since organic EL devices used for displays and lighting devices need to discharge generated light to the outside, the electrodes need to be transparent. Commonly, materials, such as ITO, are often used for the transparent electrodes. Typically, resistance of these materials is higher than that of Al or Ag. The high resistance leads to increase of light emission area, which leads to voltage drop in externally supplied electric power. The voltage drop raises a problem of causing uneven luminance in the light emitting plane. That is, those regions which are near a power supply unit are made luminous, but those regions which are farther from the power supply unit are darkened. In this case, to avoid the problem, an auxiliary electrode with a low resistance, made such as of Al is typically used. However, when an auxiliary electrode is used, the region where it is present does not emit light, or if light is emitted, the light is blocked, problematically decreasing light emission area.

In general, an organic EL device is configured such that an EL device use front plate having a translucent substrate and a high refractive index layer is laminated with a light emitting part having an anode and a cathode. Alternatively, an organic EL device is configured such that an EL device use front plate having a translucent substrate, a high refractive index layer, and a transparent anode part is laminated with a light emitting part having a cathode. The problems of the organic EL devices mentioned above also apply to such front plates for EL devices.

The present invention, in one embodiment, can provide an EL device use front plate, which enables efficient light extraction and has a low resistance, and providing a lighting device provided with the EL device use front plate.

An EL device use front plate according to a first aspect of the present invention includes: a translucent substrate; a high refractive index layer laminated on a first surface of the translucent substrate; and an electrically conductive light reflection layer having electrical conductivity and light reflectivity, laminated on a part of a back surface of the high refractive index layer which is on an opposite side to a surface where the translucent substrate is provided.

The high refractive index layer may contain fine particles having light scattering properties.

The translucent substrate may have a micro-concavo-convex structure on a second surface which is on an opposite side to the first surface.

The high refractive index layer may have a refractive index of 1.5 or more.

The translucent substrate may have fine particles having light scattering properties.

A lighting device according to a second aspect of the present invention includes: the EL device use front plate according to the first aspect; a transparent anode part laminated on a portion of the back surface of the high refractive index layer where the electrically conductive light reflection layer is not laminated, the transparent anode part also being laminated on the electrically conductive light reflection layer which is on an opposite side to a surface where the high refractive index layer is provided; a light emitting element part laminated on the transparent anode part which is on an opposite side to a surface where the electrically conductive light reflection layer is provided; and a cathode part laminated on the light emitting element part which is on an opposite side to a surface where the transparent anode part is provided.

The lighting device according to the second aspect may further include an electrically insulating layer in a region between the transparent anode part and the light emitting element part, the region overlapping with the electrically conductive light reflection layer in a thickness direction of the translucent substrate.

A lighting device according to a third aspect of the present invention includes: the EL device use front plate according to the first aspect; a transparent cathode part laminated on a portion of the back surface of the high refractive index layer where the electrically conductive light reflection layer is not laminated, the transparent cathode part also being laminated on the electrically conductive light reflection layer which is on an opposite side to a surface where the high refractive index layer is provided; a light emitting element part laminated on the transparent cathode part which is on an opposite side to a surface where the electrically conductive light reflection layer is provided; and an anode part laminated on the light emitting element part which is on an opposite side to a surface where the transparent cathode part is provided.

An EL device use front plate according to a fourth aspect of the present invention includes: a translucent substrate; a high refractive index layer laminated on a first surface of the translucent substrate; a transparent anode part laminated on the high refractive index layer which is on an opposite side to a surface where the translucent substrate is provided; and an electrically conductive light reflection layer having electrical conductivity and light reflectivity, laminated on a part of a back surface of the transparent anode part which is on an opposite side to a surface where the high refractive index layer is provided.

The high refractive index layer may have fine particles having light scattering properties.

The translucent substrate may have a micro-concavo-convex structure on a second surface which is on an opposite side to the first surface.

The high refractive index layer may have a refractive index of 1.5 or more.

The translucent substrate may have fine particles having light scattering properties.

A lighting device according to a fifth aspect of the present invention includes: the EL device use front plate according to the fourth aspect; a light emitting element part laminated on a portion of the back surface of the transparent anode part where the electrically conductive light reflection layer is not laminated, the light emitting element part also being laminated on the electrically conductive light reflection layer which is on an opposite side to a surface where the transparent anode part is provided; and a cathode part laminated on the light emitting element part which is on an opposite side to a surface where the electrically conductive light reflection layer is provided.

The lighting device according to the fifth aspect may further include an electrically insulating layer covering the electrically conductive light reflection layer laminated on the transparent anode part.

An EL device use front plate according to a sixth aspect of the present invention includes: a translucent substrate; a high refractive index layer provided on a first surface of the translucent substrate, and having a refractive index higher than that of the translucent substrate; and an electrically conductive light reflection layer having electrical conductivity and light reflectivity, laminated on a portion corresponding to a non-luminous region formed around a luminous island region on a surface of the high refractive index layer which is on an opposite side to a surface where the translucent substrate is provided.

Thus, in the luminous region, if light emitted from the light emitting element part is totally reflected off the interface between the translucent substrate and the high refractive index layer, the light is reflected off the electrically conductive light reflection layer in the non-luminous region and can be extracted. In the luminous region, if light emitted from the light emitting element part is totally reflected off the interface between the translucent substrate and the outside, the light is reflected off the electrically conductive light reflection layer in the non-luminous region and can be extracted. Accordingly, light emitted from the light emitting element part is suppressed from being totally reflected off both surfaces of the translucent substrate and returning to the light emitting element part, enabling efficient light extraction.

The EL device use front plate according to the sixth aspect may further include a scattering part provided to a portion corresponding to the non-luminous region.

Thus, if light emitted from the light emitting element part is totally reflected off the interface between the translucent substrate and the high refraction flat layer in the luminous region, the light can be extracted by the scattering part in the non-luminous region. In the luminous region, if light emitted from the light emitting element part is totally reflected off the interface between the translucent substrate and the outside, the light is reflected off the scattering part in the non-luminous region and can be extracted. Accordingly, light emitted from the light emitting element part is suppressed from being totally reflected off both surfaces of the translucent substrate and returning to the light emitting element part, enabling more efficient light extraction.

A lighting device according to a seventh aspect of the present invention includes: the EL device use front plate according to the sixth aspect; a transparent anode part laminated on the high refractive index layer which is on an opposite side to a surface where the translucent substrate is provided; a light emitting element part laminated on the transparent anode part which is on an opposite side to a surface where the electrically conductive light reflection layer is provided; and a cathode part laminated on the light emitting element part which is on an opposite side to a surface where the transparent anode part is provided.

Thus, light emitted from the light emitting element part is suppressed from being totally reflected off both surfaces of the translucent substrate and returning to the light emitting element part, enabling efficient light extraction.

In the luminous region, the light emitting element part may be in contact with the transparent anode part. In the luminous region, the high refractive index layer may have a refractive index of 1.5 or more. Light emitted from the light emitting element part may be totally reflected off an interface between the high refractive index layer and the translucent substrate.

Thus, light emitted from the light emitting element part can be suppressed from being totally reflected and returning to the light emitting element part, enabling efficient light extraction.

In the luminous region, a relation expressed by $B > (A/2)$ may be ensured to be satisfied in the luminous region, where $B$ is a thickness from the light emitting element part to the translucent substrate, and $A$ is a diameter of the luminous region.

Thus, light emitted from the light emitting element part can be suppressed from being totally reflected off the interface between the translucent substrate and the high refraction flat layer and returning to the light emitting element part, enabling efficient light extraction in the non-luminous region.

In the non-luminous region, an insulating layer may be laminated between the transparent anode part and the light emitting element part.

Thus, there is no longer emission of light which would be wasted on the electrically conductive light reflection layer. Accordingly, the light emitting element part does not have to be patterned and thus the fabrication process steps can be simplified.

As the scattering part, a high refraction scattering layer may be provided between the high refractive index layer and the transparent anode part.

As the scattering part, a micro-concavo-convex structure may be provided on a surface of the high refractive index layer in contact with the translucent substrate.

As the scattering part, a micro-concavo-convex structure may be provided on a surface of the translucent substrate which is on an opposite side to a surface where the high refractive index layer is provided.

Thus, since the light that has been scattered and totally reflected can be easily extracted, the structural freedom can be improved.

The high refraction scattering layer may contain fine particles having light scattering properties.

Thus, the light that has been totally reflected off the non-light emitting layer can be efficiently scattered and extracted.

The EL device use front plate and the lighting device according to embodiments of the present invention can efficiently extract light and decrease resistance. Since a light scattering layer is not provided in the thickness direction where the light emitting element part is present, flatness can be ensured. Accordingly, the lifetime of the light emitting element part can be prolonged, and reliability of the light emitting element part can be improved as well.

REFERENCE SIGNS LIST 1, 2, 3, 10, 20, 30, 100, 100A, 100B Lighting device
1A EL device use front plate
11 Translucent substrate
11a One surface
12 High refractive index layer
12a Back surface
13 Electrically conductive light reflection layer
14 Transparent anode part
15 Light emitting element part
16 Cathode part
17 Electrically insulating layer
18 High refraction scattering layer (scattering part)
26 Transparent cathode part
27 Anode part
28, 38 Concavo-convex structure (scattering part)
R3 Non-luminous region
R4 Luminous region Obviously, numerous modifications and variations of the present invention are possible in light of the above teachings. It is therefore to be understood that within the scope of the appended claims, the invention may be practiced otherwise than as specifically described herein.

What is claimed is:

1. A lighting device, comprising:
  a front plate comprising a translucent substrate, a high refractive index layer formed on a first surface of the translucent substrate, a transparent anode formed on the high refractive index layer on an opposite side of the translucent substrate, and an electrically conductive light reflection layer formed on a back surface of the transparent anode on an opposite side of the high refractive index layer and having a plurality of opening portions;
  a light emitting element formed on the back surface of the transparent anode such that the light emitting element has part formed in the opening portions of the electrically conductive light reflection layer; and
  a cathode formed on the light emitting element on an opposite side of the electrically conductive light reflection layer,
  wherein each of the opening portions has a bottom formed through a surface of the electrically conductive light reflection layer on the back surface of the transparent anode on the opposite side of the high refractive index layer and forms a luminous region on the back surface of the transparent anode, and the electrically conductive light reflection layer forms a non-luminous region around the luminous region on the back surface of the transparent anode.

2. The lighting device of claim 1, further comprising:
  an electrically insulating layer covering the electrically conductive light reflection layer formed on the transparent anode.

3. The lighting device of claim 2, wherein the high refractive index layer includes a plurality of fine particles having light scattering property.

4. The lighting device of claim 2, wherein the translucent substrate has a micro-concavo-convex structure on a second surface opposite to the first surface.

5. The lighting device of claim 2, wherein the high refractive index layer has a refractive index of 1.5 or more.

6. The lighting device of claim 2, wherein the translucent substrate includes a plurality of fine particles having light scattering property.

7. The lighting device of claim 1, wherein the high refractive index layer includes a plurality of fine particles having light scattering property.

8. The lighting device of claim 7, wherein the translucent substrate has a micro-concavo-convex structure on a second surface opposite to the first surface.

9. The lighting device of claim 7, wherein the high refractive index layer has a refractive index of 1.5 or more.

10. The lighting device of claim 7, wherein the translucent substrate includes a plurality of fine particles having light scattering property.

11. The lighting device of claim 1, wherein the translucent substrate has a micro-concavo-convex structure on a second surface opposite to the first surface.

12. The lighting device of claim 11, wherein the high refractive index layer has a refractive index of 1.5 or more.

13. The lighting device of claim 11, wherein the translucent substrate includes a plurality of fine particles having light scattering property.

14. The lighting device of claim 1, wherein the high refractive index layer has a refractive index of 1.5 or more.

15. The lighting device of claim 1, wherein the translucent substrate includes a plurality of fine particles having light scattering property.

16. The lighting device of claim 1, wherein the surface of the electrically conductive light reflection layer on the back surface of the transparent anode has an arithmetic average roughness in a range of 100 µm to 500 µm.

17. The lighting device of claim 1, wherein the transparent anode comprises ITO.

18. The lighting device of claim 1, wherein the transparent anode comprises a conductive polymer.

19. The lighting device of claim 1, wherein the electrically conductive light reflection layer comprises at least one selected from the group consisting of Mo, Ni, Al and Ag.

20. The lighting device of claim 1, wherein the light emitting element is formed such that the luminous region satisfies B>(A/2) where B is a thickness from the light emitting element to the translucent substrate, and A is a diameter of the luminous region.

21. The lighting device of claim 1, wherein the high refractive index layer includes a plurality of fine particles having light scattering property in an amount of 40 w % or less.

22. The lighting device of claim 1, wherein the high refractive index layer has a refractive index in a range of 1.5 to 2.0.

23. The lighting device of claim 1, wherein the high refractive index layer has a refractive index in a range of 1.7 to 1.85.

24. The lighting device of claim 1, wherein the electrically conductive light reflection layer has the plurality of opening portions arrayed in a lattice pattern and formed such that each of the opening portions has a rectangular shape.

25. The lighting device of claim 1, wherein the electrically conductive light reflection layer has the plurality of opening portions arrayed in a staggered pattern and formed such that each of the opening portions has a rectangular shape.

26. The lighting device of claim 1, wherein the electrically conductive light reflection layer has the plurality of opening portions arrayed in a honeycomb pattern and formed such that each of the opening portions has a circular shape.

* * * * *